United States Patent
Whetsel

(10) Patent No.: US 11,726,135 B2
(45) Date of Patent: Aug. 15, 2023

(54) INTEGRATED CIRCUIT DIE TEST ARCHITECTURE

(71) Applicant: TEXAS INSTRUMENTS INCORPORATED, Dallas, TX (US)

(72) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/858,122

(22) Filed: Jul. 6, 2022

(65) Prior Publication Data
US 2022/0341985 A1 Oct. 27, 2022

Related U.S. Application Data

(62) Division of application No. 17/162,025, filed on Jan. 29, 2021, now Pat. No. 11,391,769, which is a
(Continued)

(51) Int. Cl.
*G01R 31/26* (2020.01)
*G01R 31/3177* (2006.01)
*G01R 31/3185* (2006.01)

(52) U.S. Cl.
CPC ..... *G01R 31/2607* (2013.01); *G01R 31/3177* (2013.01); *G01R 31/318513* (2013.01);
(Continued)

(58) Field of Classification Search
CPC .... G01R 31/318558; G01R 31/318513; G01R 31/318572; G01R 31/3177;
(Continued)

(56) References Cited

U.S. PATENT DOCUMENTS 7,904,774 B2 3/2011 Whetsel
8,024,631 B1 9/2011 Bertanzetti
(Continued)

OTHER PUBLICATIONS

N. Kim, D. Wu, D. Kim, A. Rahman and P. Wu, "Interposer design optimization for high frequency signal transmission in passive and active interposer using through silicon via (TSV)," 2011 IEEE 61st Electronic Components and Technology Conference (ECTC), Lake Buena Vista, FL, USA, 2011, pp. 1160-1167. (Year: 2011).*
(Continued)

*Primary Examiner* — Cynthia Britt
(74) *Attorney, Agent, or Firm* — Carl G. Peterson; Frank D. Cimino

(57) ABSTRACT

A test control port (TCP) includes a state machine SM, an instruction register IR, data registers DRs, a gating circuit and a TDO MX. The SM inputs TCI signals and outputs control signals to the IR and to the DR. During instruction or data scans, the IR or DRs are enabled to input data from TDI and output data to the TDO MX and the top surface TDO signal. The bottom surface TCI inputs may be coupled to the top surface TCO signals via the gating circuit. The top surface TDI signal may be coupled to the bottom surface TDO signal via TDO MX. This allows concatenating or daisy-chaining the IR and DR of a TCP of a lower die with an IR and DR of a TCP of a die stacked on top of the lower die.

20 Claims, 18 Drawing Sheets

Related U.S. Application Data division of application No. 16/713,938, filed on Dec. 13, 2019, now Pat. No. 10,935,591, which is a division of application No. 16/047,263, filed on Jul. 27, 2018, now Pat. No. 10,539,606, which is a division of application No. 15/616,476, filed on Jun. 7, 2017, now Pat. No. 10,067,188, which is a division of application No. 14/590,502, filed on Jan. 6, 2015, now Pat. No. 9,709,630, which is a division of application No. 13/765,260, filed on Feb. 12, 2013, now Pat. No. 8,977,919.

(60) Provisional application No. 61/654,207, filed on Jun. 1, 2012, provisional application No. 61/601,292, filed on Feb. 21, 2012.

(52) U.S. Cl.
CPC ........... *G01R 31/318558* (2013.01); *G01R 31/318572* (2013.01); *G01R 31/318552* (2013.01); *G01R 31/318594* (2013.01)

(58) Field of Classification Search
CPC .... G01R 31/318552; G01R 31/318594; G01R 31/2607
See application file for complete search history.

(56) References Cited

U.S. PATENT DOCUMENTS

| | | | |
|---|---|---|---|
| 8,063,654 B2 | 11/2011 | Rahman et al. | |
| 8,522,096 B2 | 8/2013 | Wang et al. | |
| 8,561,001 B1 | 10/2013 | Goel | |
| 8,751,994 B2 | 6/2014 | Goel | |
| 8,793,547 B2 | 7/2014 | Loh et al. | |
| 8,977,919 B2 | 3/2015 | Whetsel | |
| 9,164,147 B2 | 10/2015 | Chi | |
| 9,239,359 B2 | 1/2016 | Marinissen et al. | |
| 2002/0184562 A1 | 12/2002 | Nadeau-Dosti et al. | |
| 2003/0009715 A1 | 1/2003 | Ricchetti et al. | |
| 2008/0256274 A1 | 10/2008 | Wohl | |
| 2009/0228231 A1 | 9/2009 | Hakoo et al. | |
| 2009/0259889 A1 | 10/2009 | Luo | |
| 2011/0148456 A1* | 6/2011 | Mooyman-Beck | G01R 31/318511 361/807 |
| 2013/0111286 A1 | 5/2013 | Tekumalla | |
| 2013/0153896 A1* | 6/2013 | Whetsel | G01R 31/2853 257/48 |
| 2018/0080988 A1 | 3/2018 | Whetsel | |

OTHER PUBLICATIONS

Real, R. A; van Driel, W.D.; Yang, D.G.; Zhang, G.Q.; Pasion, J., "Stacking Dies Combined Virtual Prototyping and Reliability Testing Based Design Rules," Electronic Components and Technology Conference, 2007. ECTC '07. Proceedings. 57th, vol. No., pp. 1720, 1724, May 29 2007-Jun. 1, 2007.

Lewis, D.L.; Lee, H.-H. S., "Testing Circuit-Partitioned 3D IC Designs," VLSI, 2009. ISVLSI '09. IEEE Computer Society Annual Symposium on, vol. No., pp. 139, 144, May 13-15, 2009.

Van Driel, W.D.; Real, R.A.; Yang, D.G.; Zhang, G.Q.; Pasion, J., "Combined Virtual Prototyping and Reliability Testing Based Design Rules for Stacked Die Systems in Packages," Thermal, Mechanical and Multi-Physics Simulation Experiments in Microelectronics and Micro-Systems, 2007. EutoSime 2007. International Conference on, vol. No., pp. 1, 5, 16-21.

Stucchi, M.; Perry, D.; Katti, G.; Dehaene, W., "Test structures for characterization of through silicon vias," Microelectronic Structures (ICMTS), 2010 IEEE International Conference on, vol. No., pp. 130, 134, Mar. 22-25, 2010.

B. S. Gupta, U. Ingelsson and E. Larsson, "Test Planning for Core-based 3D Stacked ICs with Through-Silicon Vias," 2012 25th International Conference on VLSI Design, Hyderabad, 2012, pp. 442-447. (Year: 2012).

R. M. Lea et al., "A 3-D stacked chip packaging solution for miniaturized massively parallel processing," in IEEE Transactions on Advanced Packaging, vol. 22, No. 3, pp. 424-432, Aug. 1999. (Year: 1999).

X. Wang, D. Vasudevan and H. S. Lee, "Global Built-In Self-Repair for 3D memories with redundancy sharing and parallel testing," 2011 IEEE International 3D Systems Integration Conference (3DIC), 2011 IEEE International, Osaka, 2012, pp. 1-8. (Year: 2012).

M. Guilbins, F. Hopsch, P. Schneider, B. Straube and W. Vermeiren, "Developing digital test sequences for through-silicon vias within 3D structures," 2010 IEEE International 3D Systems Integration Conference (3DIC), Munich, 2010, pp. 1-6. (Year: 2010).

E.J. Marinissen and Y. Zorian, "Testing 3D Chips Containing Through-Silicon Vias," in Proc. IEEE International Test Conference, Paper ET1 .1, Nov. 2009, pp. 1-11. (Year: 2009).

* cited by examiner

INTEGRATED CIRCUIT DIE TEST ARCHITECTURE

RELATED APPLICATIONS

This application is a divisional of prior application Ser. No. 17/162,025, filed Jan. 29, 2021, currently pending;

Which was a divisional of prior application Ser. No. 16/713,938, filed Dec. 13, 2019, now U.S. Pat. No. 10,935,591, granted Mar. 2, 2021;

Which was a divisional of prior application Ser. No. 16/047,263, filed Jul. 27, 2018, now U.S. Pat. No. 10,539,606, granted Jan. 21, 2020;

Which was a divisional of prior application Ser. No. 15/616,476, filed Jun. 7, 2017, now U.S. Pat. No. 10,067,188, granted Sep. 4, 2018;

Which was a divisional of prior application Ser. No. 14/590,502, filed Jan. 6, 2015, now U.S. Pat. No. 9,709,630, granted Jul. 18, 2017;

Which was a divisional of prior application Ser. No. 13/765,260, filed Feb. 12, 2013, now U.S. Pat. No. 8,977,919, granted Mar. 10, 2015;

Which claims priority from Provisional Application No. 61/654,207, filed Jun. 1, 2012;

And also claims priority from Provisional Application No. 61/601,292, filed Feb. 21, 2012.

This disclosure is related to pending patent application TI-71343 which is incorporated herein by reference.

FIELD OF DISCLOSURE

This disclosure relates to die that are designed to be used in a 3D die stack and in particular to a common test architecture designed into each die of the 3D die stack for accessing and testing digital circuits of each die using parallel scan techniques.

BACKGROUND OF THE DISCLOSURE

Die manufactured for use in a die stack must be tested at the wafer level and then potentially retested after the die are singulated to ensure only known good die are used in the stack. Each time an upper die is stacked on top of a lower die that has been tested, the upper die needs to be retested to ensure it has not been damaged during the stacking process. Also, the interconnect between the lower and upper die needs to be tested and determined good. The interconnect between die in a 3D stack is provided by Through Silicon Vias (TSVs), which are vertical signaling paths between the bottom and top surfaces of each die. This testing process is repeated for each additional upper die assembled onto the stack. It is therefore advantageous to have a common test architecture in each die and a common method of accessing the test architecture in each die, independent of the stacked location of the die.

BRIEF SUMMARY OF THE DISCLOSURE

The disclosure provides a test architecture for providing access to and control of parallel scan paths within a single die or to parallel scan paths in dies that are stacked.

DESCRIPTIONS OF THE VIEWS OF THE DISCLOSURE

DETAILED DESCRIPTION OF THE DISCLOSURE

Figure 1:
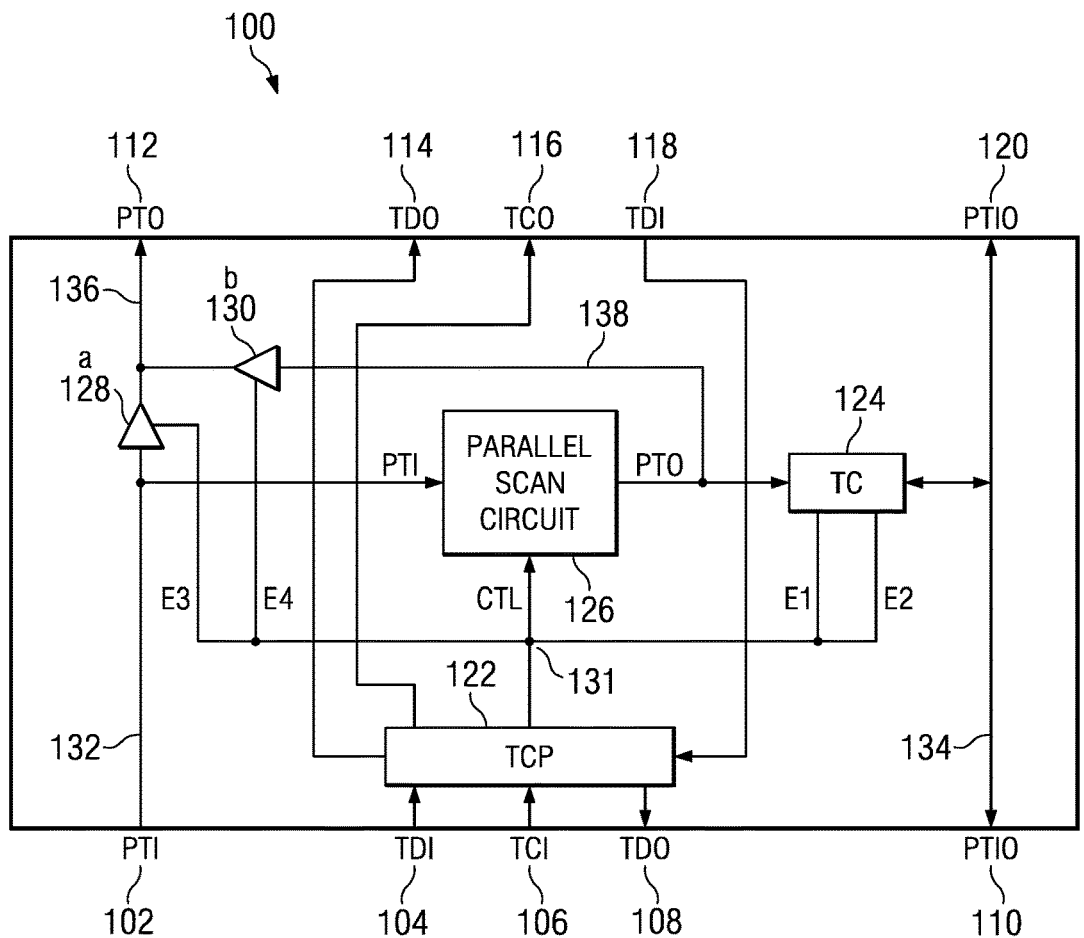
FIG. 1 illustrates a die containing the test architecture of the disclosure.

FIG. 1 illustrates a die 100 including the test architecture of the disclosure. The bottom surface of the die includes signal contact points (micro bumps or metal pads) for a Parallel Test Input (PTI) bus 102, a Test Data input (TDI) 104, Test Control Inputs (TCI) 106, a Test Data Output 108 and a Parallel Test Input/Output (PTIO) bus 110. The top surface of the die includes signal contact points for a Parallel Test Output (PTO) bus 112, TDO 114, Test Control Outputs (TCO) 116, TDI 118 and a PTIO bus 120. The architecture includes a Test Control Port (TCP) 122, a Test Circuit (TC) 124, at least one Parallel Scan Circuit 126 to be tested, a first signal coupling means illustrated in this example as signal buffers "a" 128 and a second signal coupling means illustrated in this example as signal buffers "b" 130. TCP is connected to the TDI, TCI and TDO bottom surface signals and the TDO, TCO and TDI top surface signals. TCP includes a control (CTL) output bus 131 that is connected to the buffers, Parallel Scan Circuit and TC.

The Parallel Scan Circuit inputs PTI signals from the PTI bus 102 via TSV signal connections 132 and outputs PTO signals to buffers "b" and to the TC. The TC is connected to the PTIO bus TSV signal connections 134 for outputting data onto the PTIO 110 bus or inputting data from the from the PTIO bus 120. The outputs of buffers "a" and "b" are connected together and to the top surface PTO bus 112 via TSV signal connections 136. If the top surface PTO bus 112 is to be driven from the bottom PTO bus, buffers "a" are enabled by an enable 3 (E3) signal from the TCP CTL bus 131 and buffers "b" are disabled by enable 4 (E4) from the TCP CTL bus 131. If the top surface PTO bus 112 is to be driven by the PTO output 138 of the Parallel Scan Circuit, buffers "b" are enabled by E4 and buffers "a" are disabled by E3.

While the first and second signal coupling means are shown to be buffers "a" 128 and "b" 130, the first and second coupling means could be realized using other types of circuitry such as but not limited to a multiplexer or transistor switches to allow the PTO bus 112 to be driven by either the PTI bus 102 or by the PTO bus 138 output from the Parallel Scan Circuit.

Figure 2:
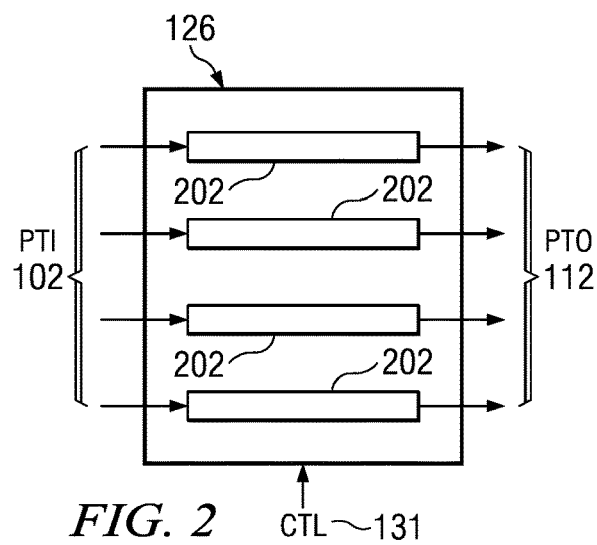
FIG. 2 illustrates a conventional parallel scan path arrangement that can be accessed and controlled by the test architecture of the disclosure.

FIG. 2 illustrates one example implementation of the Parallel Scan Circuit 126 of FIG. 1. In this example, scan paths 202 input test data from PTI and output test data to PTO. The scan paths are controlled by the CTL inputs from the TCP.

Figure 3:
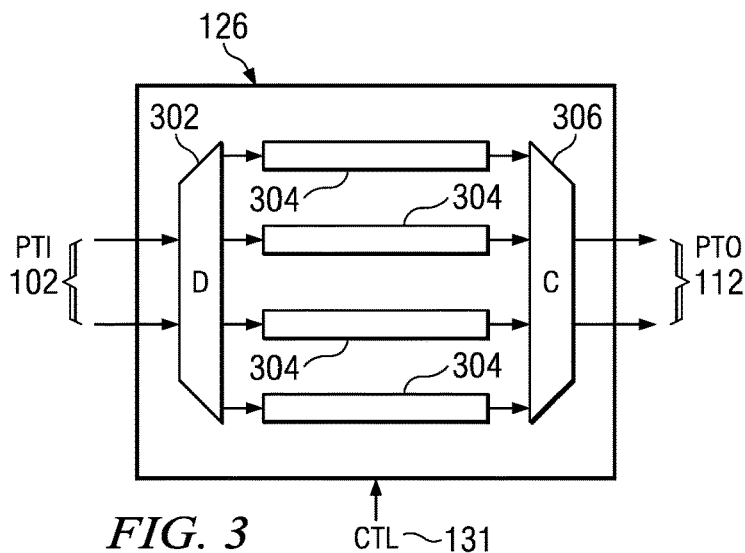
FIG. 3 illustrates a conventional parallel scan compression arrangement that can be accessed and controlled by the test architecture of the disclosure.

FIG. 3 illustrates another example implementation of the Parallel Scan Circuit 126 of FIG. 1. In this example, a decompressor (D) 302 inputs compressed test data from PTI and outputs decompressed test data to parallel scan paths 304, and a compactor (C) 306 inputs test data from the parallel scan paths and outputs compacted data on PTO. The decompressor, scan paths and compactor are controlled by the CTL inputs from the TCP.

While not shown in FIGS. 2 and 3, system clock inputs and associated circuitry may be used in conjunction with the TCP CTL signals to improve the at-speed testing of the circuits, such as well known clock leaker system clock circuits.

Figure 4:
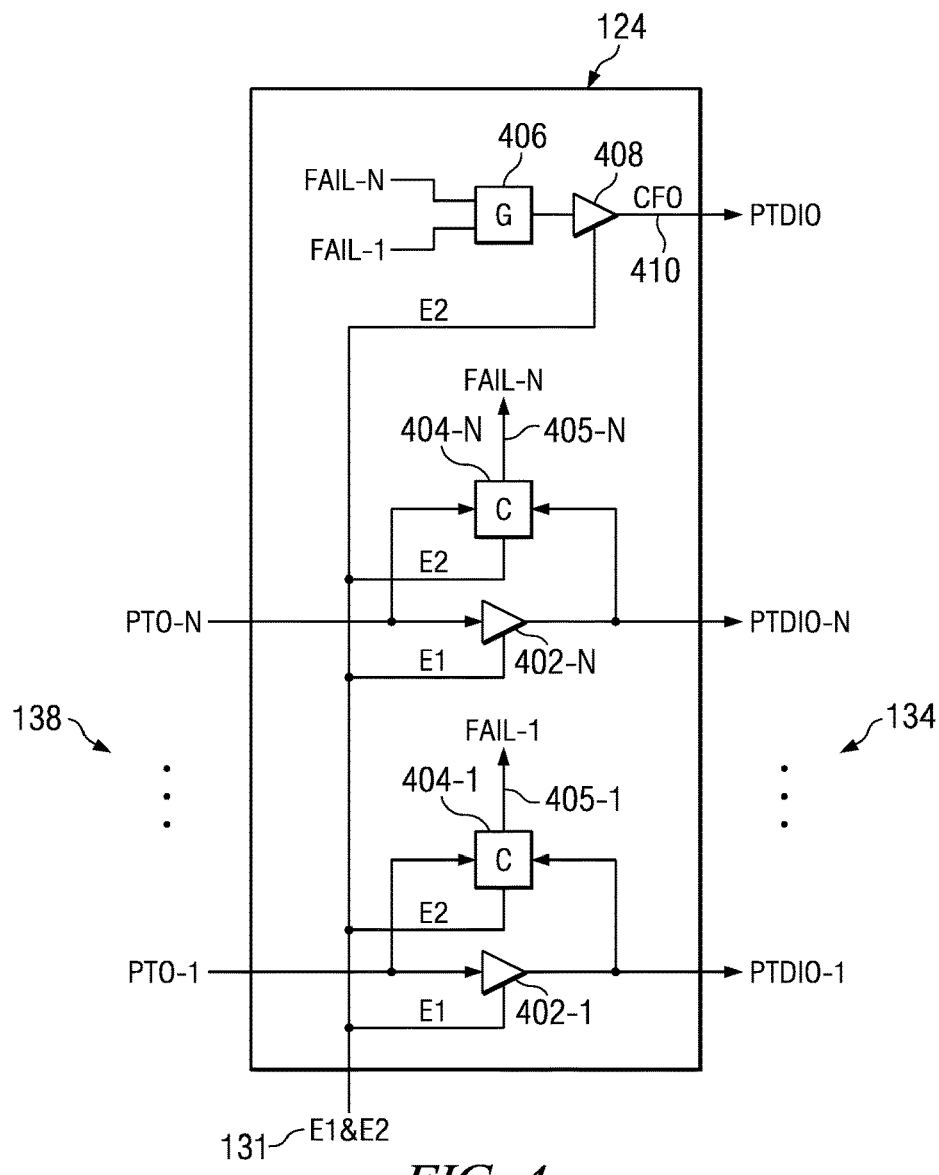
FIG. 4 illustrates a test circuit of the disclosure for either outputting parallel test output data to a tester or comparing the parallel test output data to data input from a tester.

FIG. 4 illustrates an example implementation of the TC 124 of FIG. 1. In a first mode of operation, the TC inputs PTO data 138 from the Parallel Scan Circuit and outputs it to the PTIO bus 134, via 3-state buffers 402 1-N. In a second mode of operation, the TC inputs PTO data from the Parallel Scan Circuit and compares it to data input from the PTIO bus, using comparators (C) 404 1-N. The modes are controlled by enable (E1 and E2) inputs from the CTL bus of the TCP. The comparators (C) have fail 405 1-N outputs that are set whenever a comparison failure occurs. The fail outputs are input to a gating circuit 406 that can detect when one or more fail outputs are set to indicate a failure. The output of the gating circuit passes through a 3-state buffer 408 to a Compare Fail Output (CFO) 410 that is connected to a signal path in the PTIO bus. The second mode of operation is advantageous at wafer probe since it enables multiple dies to be tested using a common PTI and PTIO bus from a tester to input test data to multiple die commonly connected to the PTI and PTIO buses.

Figure 5:
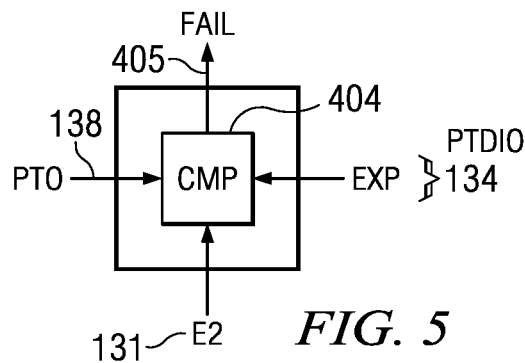
FIG. 5 illustrates a first example implementation of the comparator of FIG. 4 of the disclosure.

FIG. 5 illustrates a first example comparator (C) 404 of FIG. 4 for comparing PTO data to expected (EXP) data from the PTIO bus.

Figure 6:
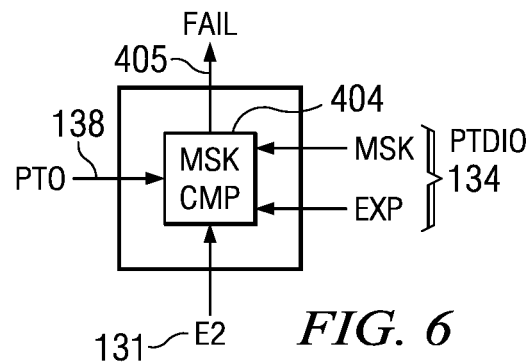
FIG. 6 illustrates a second example implementation of the comparator of FIG. 4 of the disclosure.

FIG. 6 illustrates a second example maskable comparator (C) 404 of FIG. 4 for comparing PTO data to expected (EXP) data from the PTIO bus or masking the compare operation off using mask (MSK) data input from the PTIO bus. When masked, the Fail signal output does not output a failure indication when a comparison fails.

Figure 7:
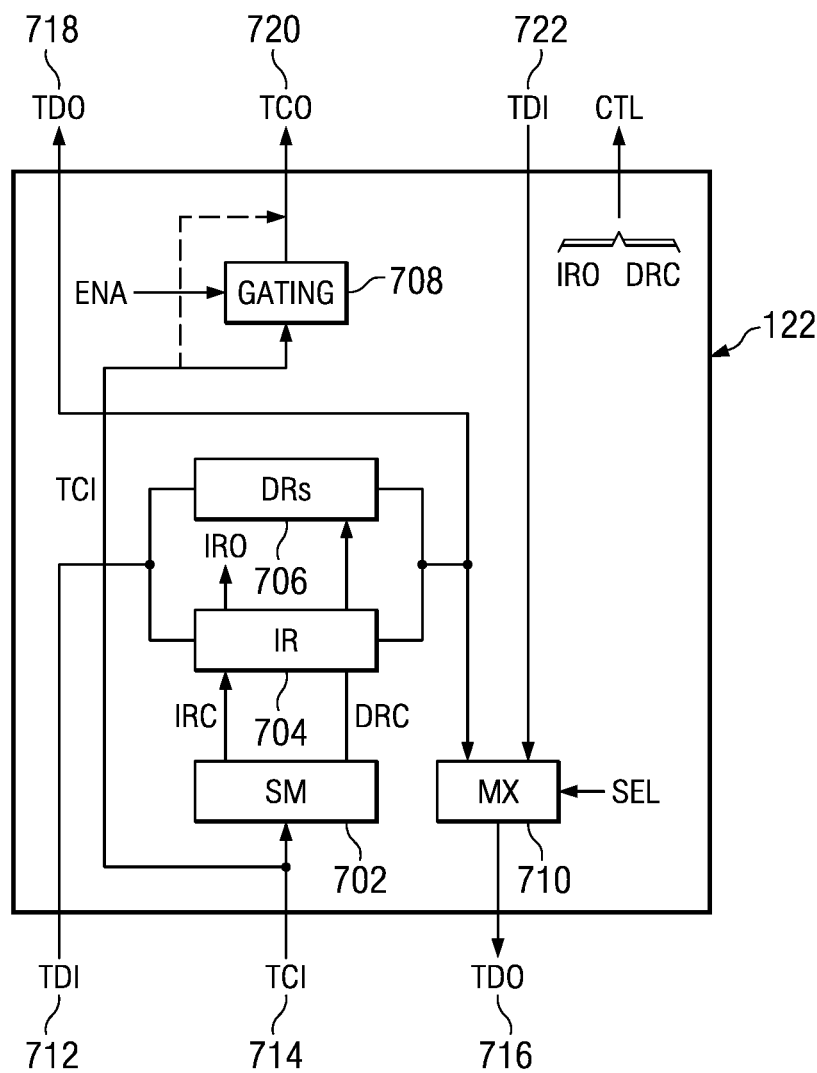
FIG. 7 illustrates a first example implementation of the test control port (TCP) of the disclosure.

FIG. 7 illustrates a first example implementation of the TCP 122 of FIG. 1 which includes a state machine (SM) 702, an instruction register (IR) 704, data registers (DRs) 706, a gating circuit 708 and a TDO multiplexer (MX) 710. The SM inputs TCI signals 714 and outputs instruction register control (IRC) signals to the IR and data register control (DRC) signals to the DR. During instruction scans, the IR is enabled by IRC inputs to input data from TDI 712 and output data to the TDO multiplexer 710 and the top surface TDO signal 718. During data scans, a DR is enabled by the DRC inputs to input data from TDI 712 and output data to the TDO multiplexer 710 and the top surface TDO signal 718.

The bottom surface TCI inputs 714 may be coupled to the top surface TCO signals 720 via the gating circuit 708. The top surface TDI signal 722 may be coupled to the bottom surface TDO signal 716 via TDO multiplexer 710. This allows concatenating or daisy-chaining the IR and DR of a TCP of a lower die with an IR and DR of a TCP of a die stacked on top of the lower die. The instruction register outputs (IRO) include an enable (ENA) signal for the gating circuit 708 and a second select (SEL) signal for TDO multiplexer 710. The CTL bus output from the TCP includes IRO signals and DRC signals. The gating circuit 708 may gate one, more than one or all of the TCI signals. Non-gated TCI signals are coupled to appropriate top surface TCO signals, as shown in dotted line. The SM, IR, and DRs of this implementation could be the TAP SM, IR and DRs as defined in the IEEE 1149.1 boundary scan standard.

Figure 8:
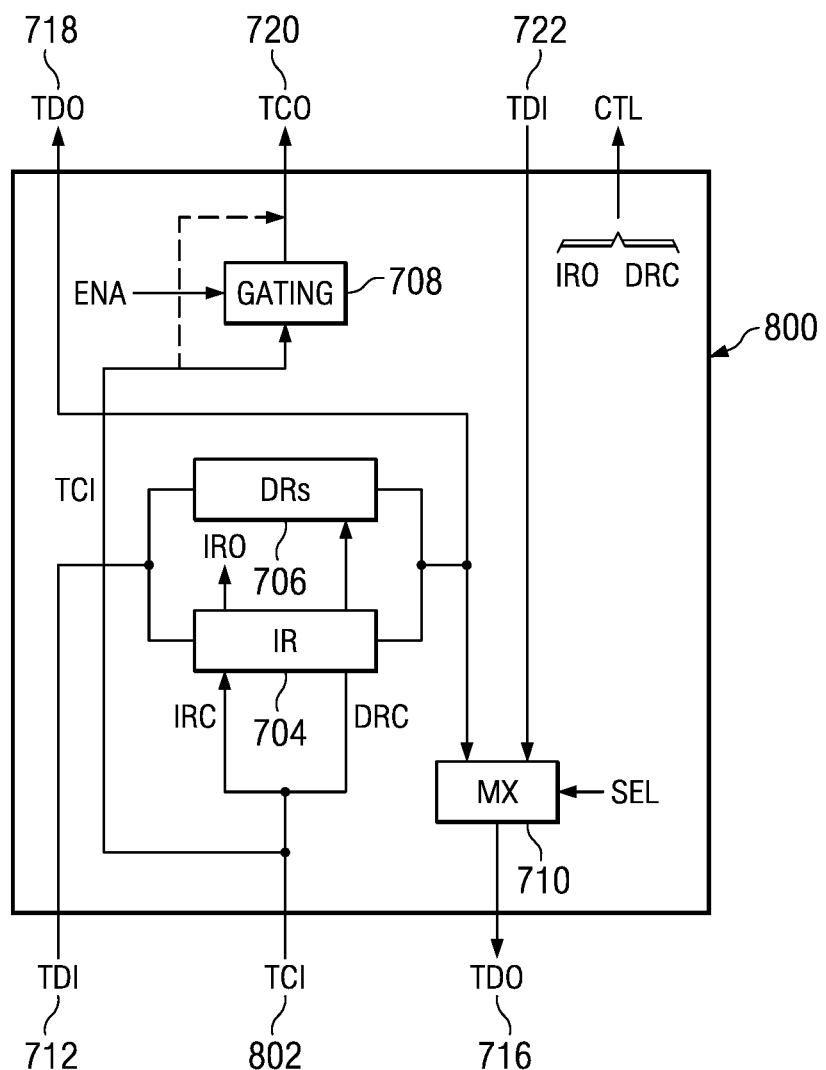
FIG. 8 illustrates a second example implementation of the TCP of the disclosure.

FIG. 8 illustrates a second example implementation 800 of the TCP 122 of FIG. 1. This implementation is identical to the FIG. 7 implementation with the exception that it does not include a SM 702. The TCI inputs 802 are coupled to the IRC inputs of IR 704 and DRC inputs of DR 706. During instruction scans, the IR is enabled by the IRC signals from the TCI inputs 802 to input data from TDI 712 and output data to the TDO multiplexer 710 and the top surface TDO signal 718. During data scans, a DR is enabled by DRC signals from the TCI inputs 802 to input data from TDI 712 and output data to the TDO multiplexer 710 and the top surface TDO signal 718.

The bottom surface TCI inputs 802 may be coupled to the top surface TCO signals 720 via the gating circuit 708. The top surface TDI signal 722 may be coupled to the bottom surface TDO signal 716 via the TDO multiplexer 710. This allows concatenating or daisy-chaining the IR and DR of a TCP 122 of a lower die with an IR and DR of a TCP 122 of a die stacked on top of the lower die. The instruction register outputs (IRO) include an enable (ENA) signal for the gating 708 circuit and the SEL signal to TDO multiplexer 710. The CTL bus output 724 from the TCP includes IRO signals and DRC signals. The gating circuit 708 may gate one, more than one or all of the TCI signals. Non-gated TCI signals are coupled to appropriate top surface TCO signals, as shown in dotted line. The TCI input bus 802, IR 704 and DRs 706 of this implementation could be the control inputs, IR and DRs as defined in IEEE 1500 core wrapper test standard.

Figure 9:
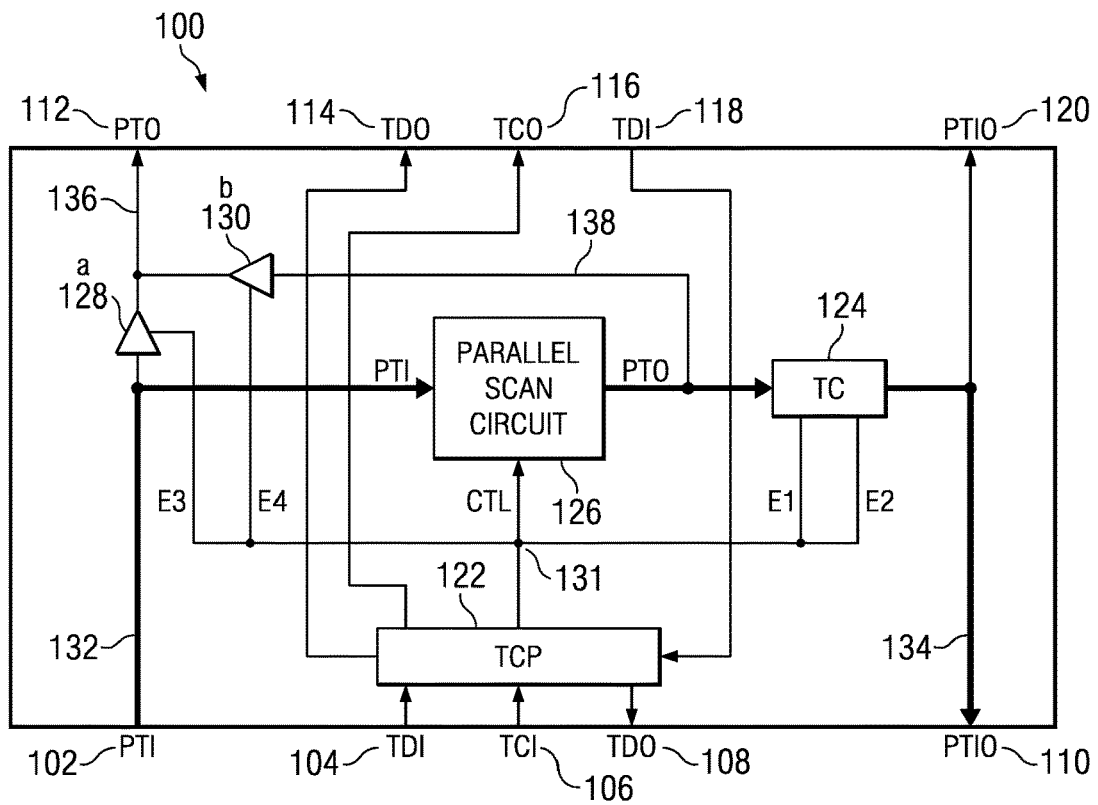
FIG. 9 illustrates the test architecture in a die operating to input parallel test input data to a parallel scan test circuit in the die and outputting parallel test output data from the parallel test circuit, according to the disclosure.

FIG. 9 illustrates the die test architecture of FIG. 1 when an instruction has been loaded into the TCP's IR to enable the Parallel Scan Circuit to be tested by inputting PTI data from the PTI bus 102 and outputting PTO data to the PTIO bus 110, as seen in darkened line. The CTL outputs 131 from the TCP 122 controls the capture and input and output shift operations of Parallel Scan Circuit 126 during test.

Figure 10:
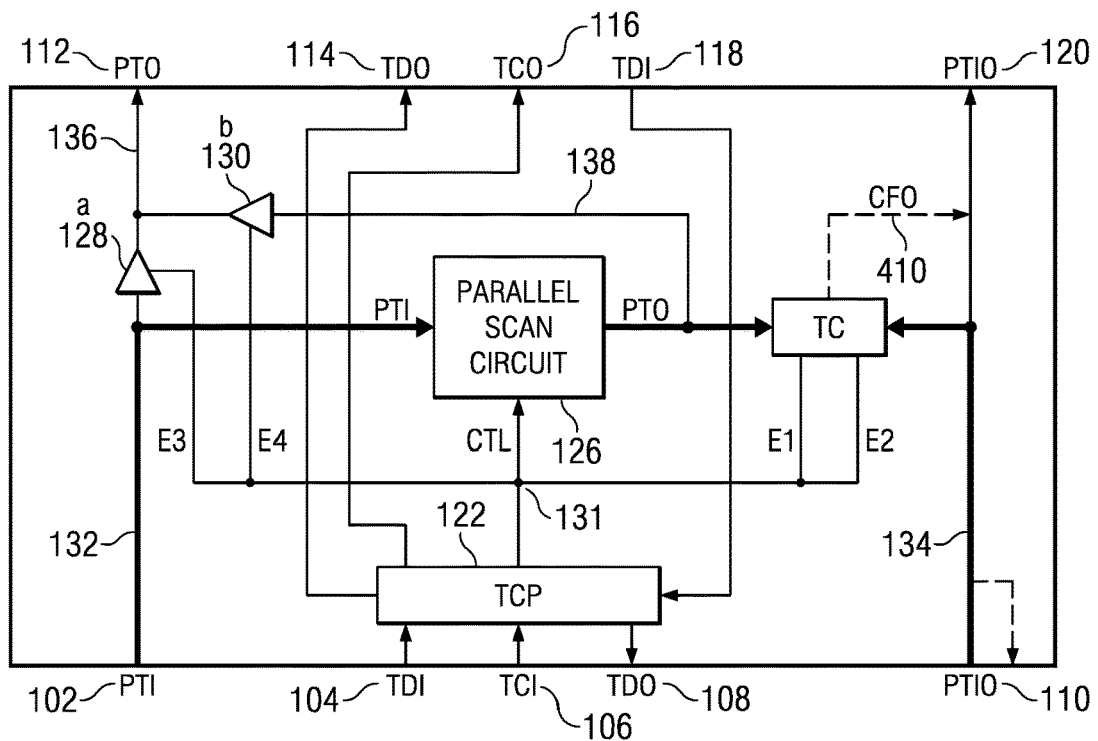
FIG. 10 illustrates the test architecture operating to input parallel test input data to a parallel test circuit and comparing the parallel test output data with data input to the test circuit, according to the disclosure.

FIG. 10 illustrates the die test architecture of FIG. 1 when an instruction has been loaded into the TCP's IR to enable the Parallel Scan Circuit 126 to be tested by inputting PTI data from the PTI bus 102 and comparing the PTO output data from the Parallel Scan Path 126 with data input from the PTIO bus 110, as seen in darkened line. The CTL outputs from the TCP 122 controls the capture and input and output shift operations of Parallel Scan Circuit 126 during test. During this test, the CFO output 410 (dotted line) of the TC 124 of FIG. 4 is enabled to output comparison failures on the PTIO bus 110.

Figure 11:
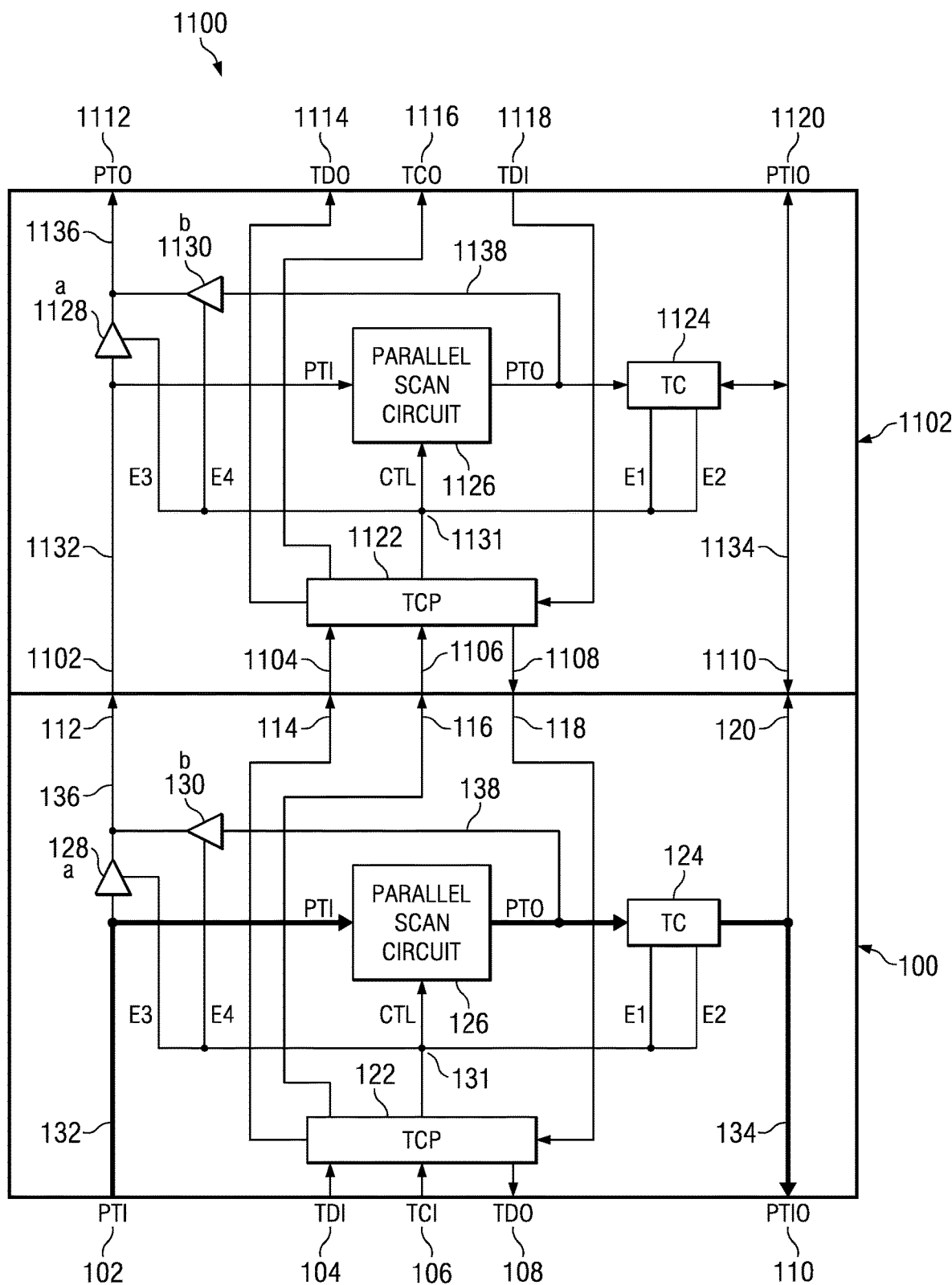
FIG. 11 illustrates a stack die arrangement where the lower die is tested as described in FIG. 9, according to the disclosure.

FIG. 11 illustrates a stack 1100 including a bottom die 100 and a top die 1102, both including the die test architecture of FIG. 1. In this example, the Parallel Scan Circuit 126 of the bottom die 100 is being tested as described in FIG. 9. The IR of the TCP 1122 of the top die has been loaded with an instruction which place the top die in a quiescent mode that ignores the testing of the bottom die, does not interfere with the testing of the bottom die and disables the tri-state buffers of TC 1124 of the top die. The TCO outputs 116 from the bottom die to the TCI inputs 1106 of the top die will typically be gated off during testing of the bottom die.

Figure 12:
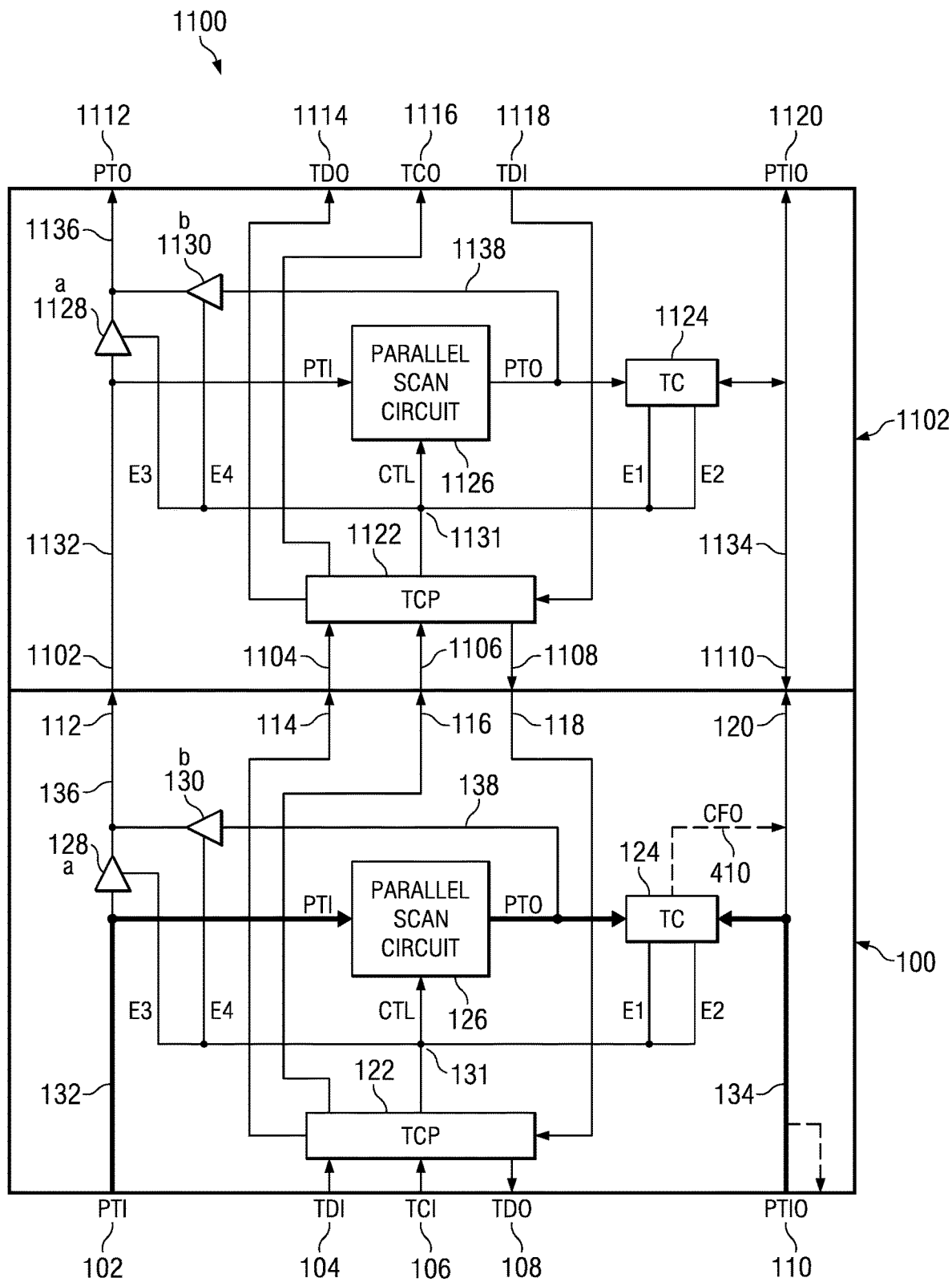
FIG. 12 illustrates a stack die arrangement where the lower die is tested as described in FIG. 10, according to the disclosure.

FIG. 12 illustrates a stack 1100 including a bottom die 100 and a top die 1102, both including the die test architecture of FIG. 1. In this example, the Parallel Scan Circuit 126 of the bottom die 100 is being tested as described in FIG. 10. The IR of the TCP 1122 of the top die 1102 has been loaded with an instruction which places the top die in a quiescent mode that ignores the testing of the bottom die, does not interfere with the testing of the bottom die and disables the tri-state buffers of TC 1124 of the top die. The TCO outputs 116 from the bottom die to the TCI inputs 1106 of the top die will typically be gated off during testing of the bottom die.

Figure 13:
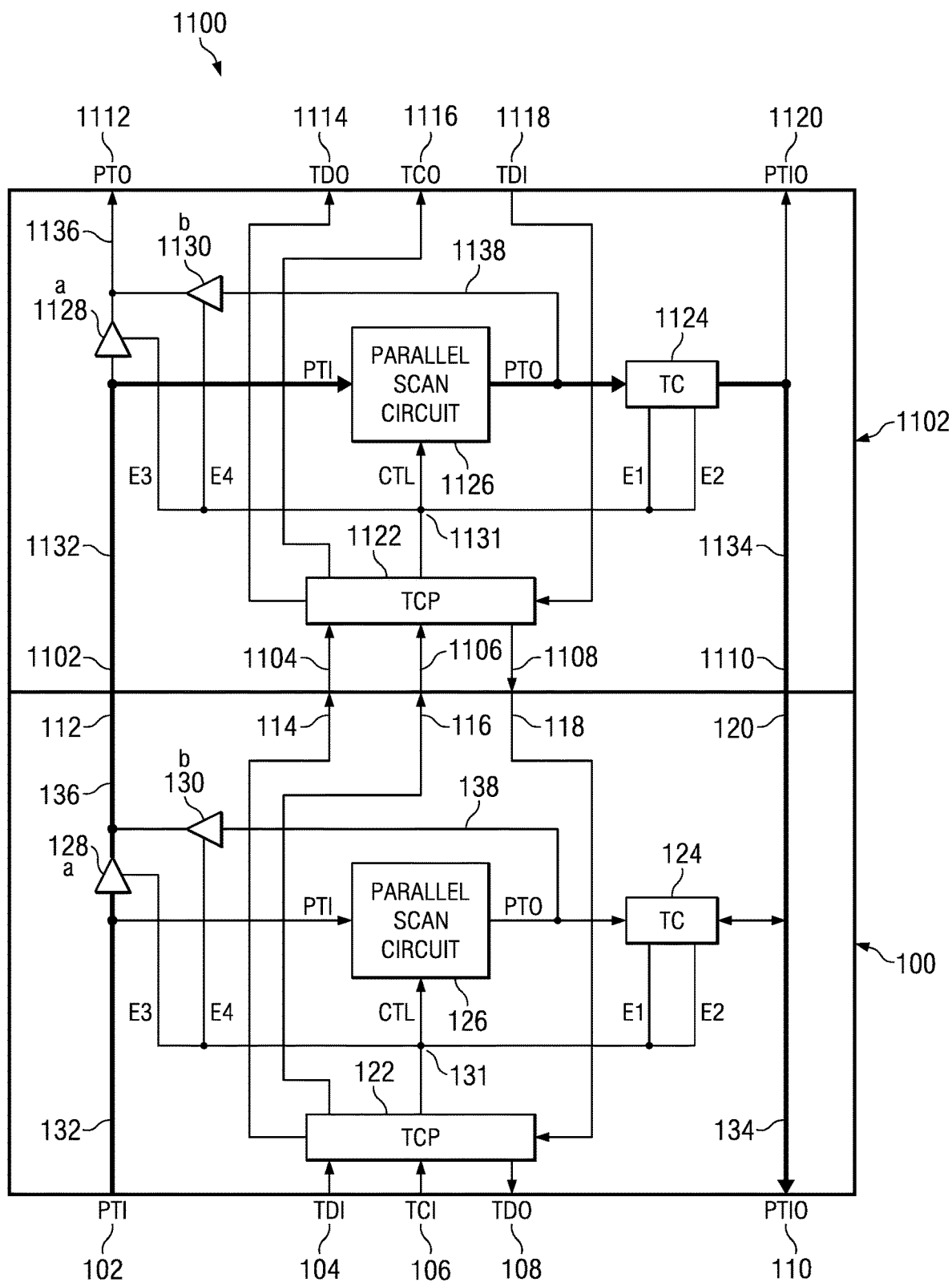
FIG. 13 illustrates a stack die arrangement where the upper die is tested as described in FIG. 9, via the lower die, according to the disclosure.

FIG. 13 illustrates a stack 1100 including a bottom die 100 and a top die 1102, both including the die test architecture of FIG. 1. In this example, the Parallel Scan Circuit 1126 of the top die 1102 is being tested as described in FIG. 9. The IR of the TCP 122 of the bottom die 100 has been loaded with an instruction which place the bottom die 100 in a quiescent mode that ignores the testing of the top die 1102, does not interfere with the testing of the top die, disables the tri-state buffers of TC 124 of the bottom die and enables buffers "a" 128 to pass the PTI signals up to the top die. The TCO outputs from the bottom die 116 to the top die 1106 will be gated on during testing of the top die to control the top die's TCP 1122.

Figure 14:
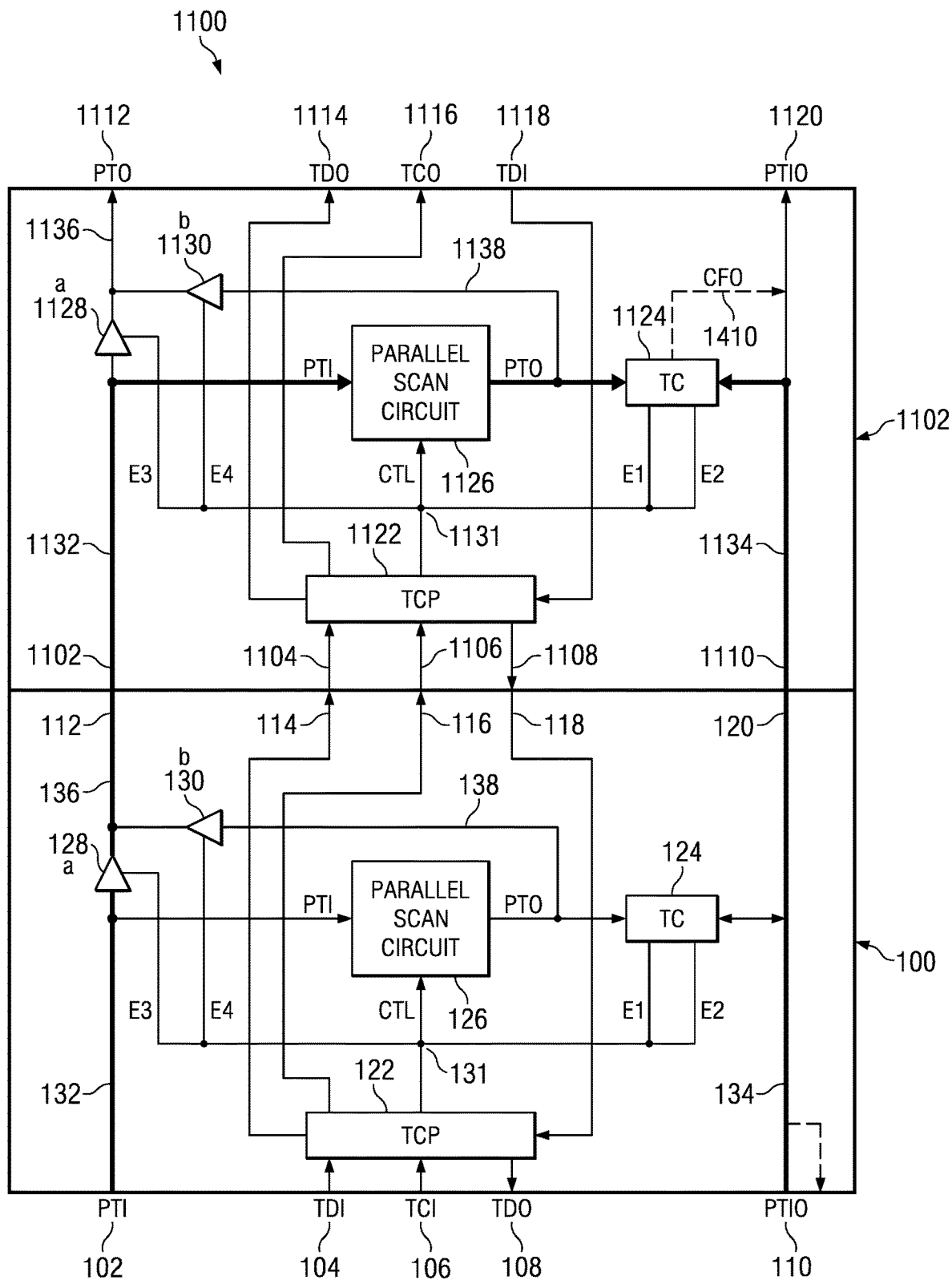
FIG. 14 illustrates a stack die arrangement where the upper die is tested as described in FIG. 10, via the lower die, according to the disclosure.

FIG. 14 illustrates a stack 1100 including a bottom die 100 and a top die 1102, both including the die test architecture of FIG. 1. In this example, the Parallel Scan Circuit 1126 of the top die 1102 is being tested as described in FIG. 10. The IR of the TCP 122 of the bottom die 100 has been loaded with an instruction which place the bottom die in a quiescent mode that ignores the testing of the top die, does not interfere with the testing of the top die, disables the tri-state buffers of TC 124 of the bottom die and enables buffers "a" 128 to pass the PTI signals up to the top die. The TCO outputs from the bottom die 116 to the top die 1106 will be gated on during testing of the top die to control the top die's TCP 1122.

Figure 15:
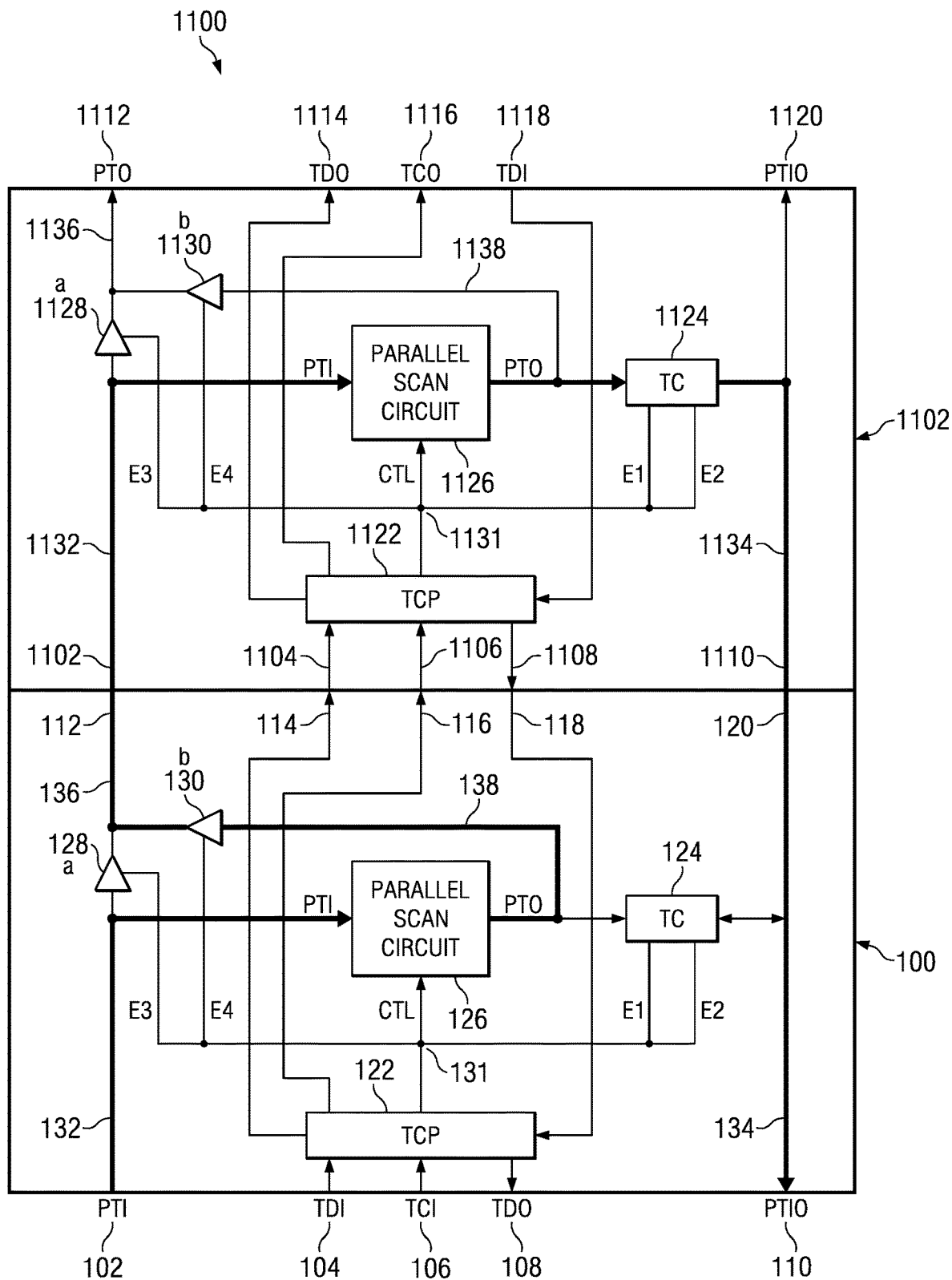
FIG. 15 illustrates a stack die arrangement where the parallel scan circuits of the lower and upper die are daisy-chained together and tested as described in FIG. 9, according to the disclosure.

FIG. 15 illustrates a stack 1100 including a bottom die 100 and a top die 1102, both including the die test architecture of FIG. 1. In this example, instructions have been loaded into the IRs of the TCPs 122, 1122 of the bottom and top die to daisy-chain the Parallel Scan Circuits 126, 1126 of the bottom and top die together to form a PTI to PTO path through both Parallel Scan Circuits, from the PTI 102 of the bottom die to the PTIO 110 of the bottom die. The instruction loaded in the bottom die TCP 122 enables buffers "b" 130 to drive the PTI inputs to the top die, disables the tri-state buffers of TC 124 of the bottom die and gates on the TCO outputs 116 to the TCI inputs 1116 of the top die. The instruction in the TCP of the top die enables the tri-state buffers of TC 1124 of the top die to drive the PTIO bus 1134, 134, 110.

Figure 16:
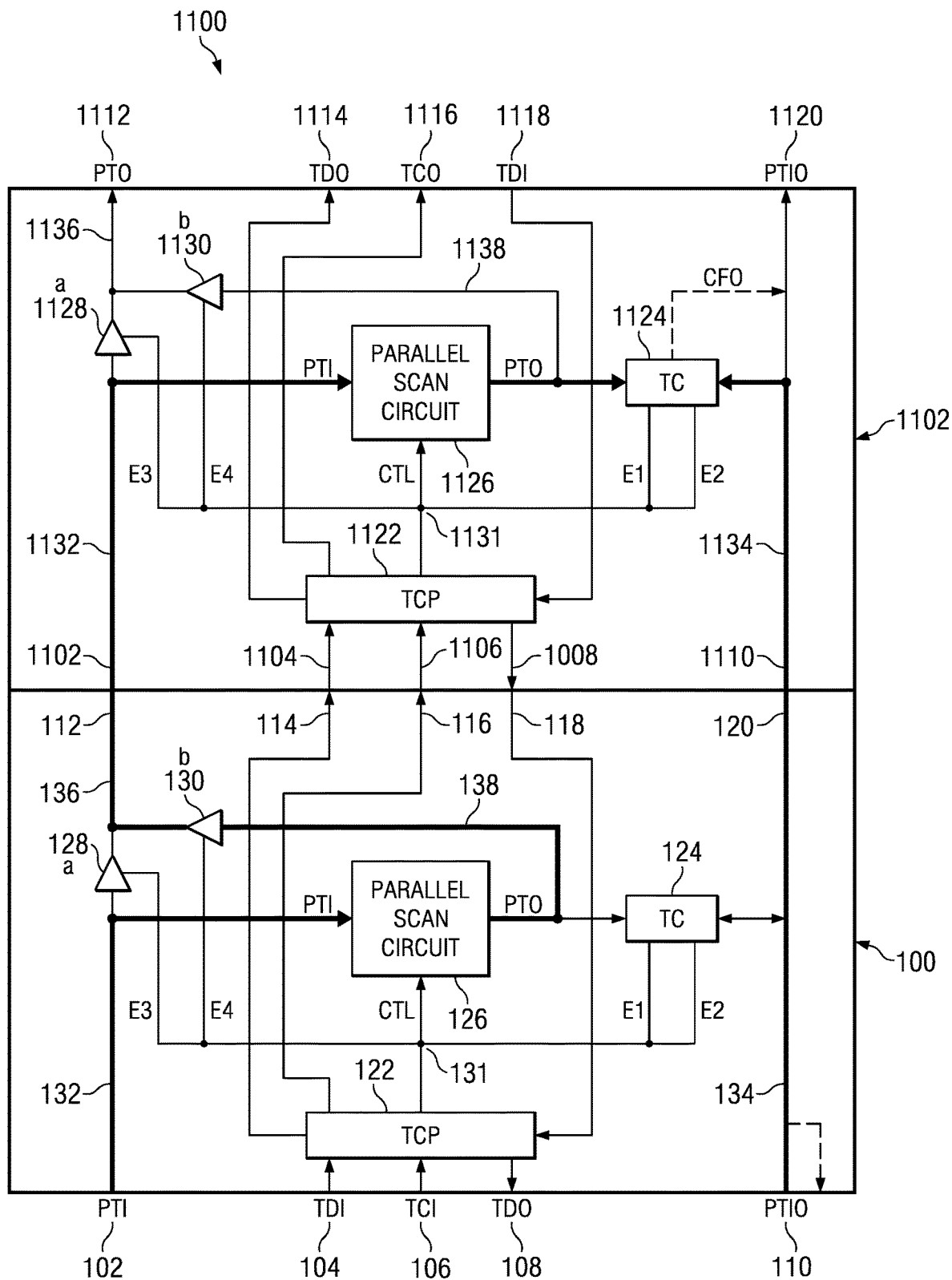
FIG. 16 illustrates a stack die arrangement where the parallel scan circuits of the lower and upper die are daisy-chained together and tested as described in FIG. 10, according to the disclosure.

FIG. 16 illustrates a stack 1100 including a bottom die 100 and a top die 1102, both including the die test architecture of FIG. 1. In this example, instructions have been loaded into the IRs of the TCPs 122, 1122 of the bottom and top die to daisy-chain the Parallel Scan Circuits 126, 1126 of the bottom and top die together to form a PTI to PTO path through both Parallel Scan Circuits, from the PTI 102 of the bottom die to the PTO inputs to TC 1124 of the top die. The instruction loaded in the bottom die TCP 122 enables buffers "b" 130 to drive the PTI inputs to the top die, disables the tri-state buffers of TC 124 of the bottom die and gates on the TCO 116 outputs to the TCI inputs 1106 of the top die. The instruction in the TCP 1122 of the top die disables the tri-state buffers of TC 1124 of the top die so that data from PTIO 110 can be input to the comparators of TC 1124 to compare against the PTO data being input to the comparator from the Parallel Scan Circuit 1126 of the top die.

While the stack die examples of FIGS. 11-16 show only two dies including the test architecture of the disclosure in the stack, the stack could contain any number of stacked dies including the test architecture of the disclosure.

Figure 17:
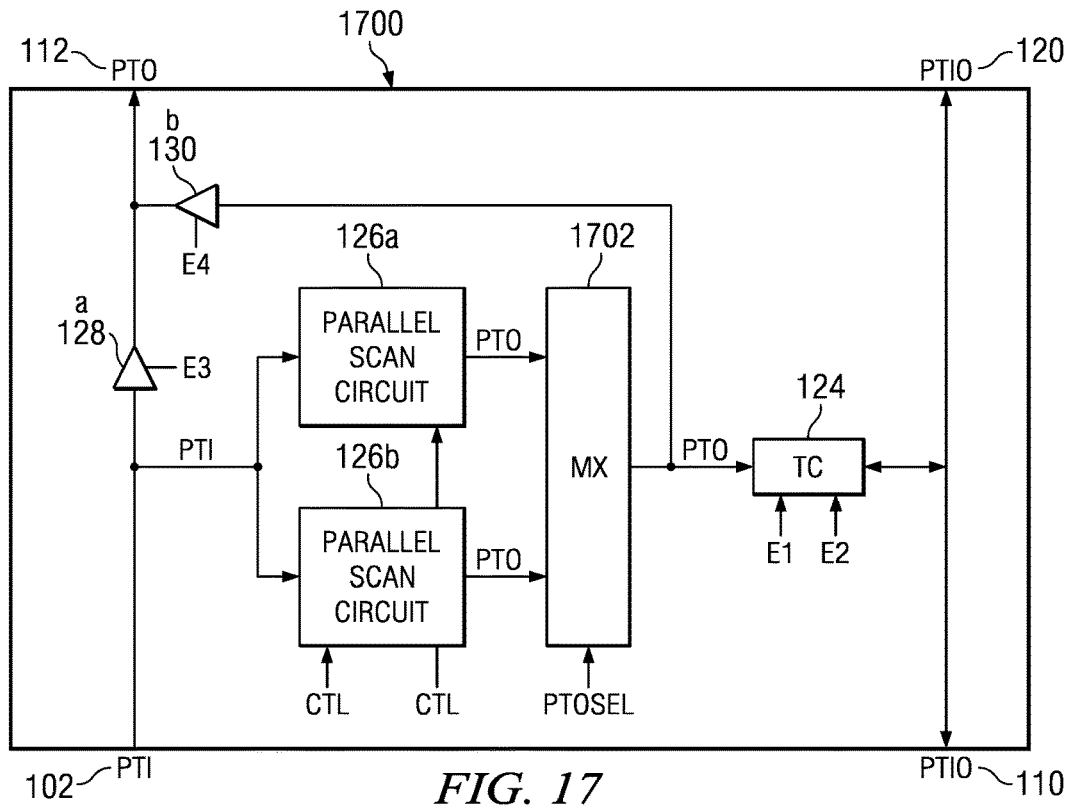
FIG. 17 illustrates a die containing multiple selectable parallel scan circuits that may be tested as described in FIG. 9 or FIG. 10, according to the disclosure.

While in the preceding Figure examples, only one Parallel Scan Circuit 126 was shown in a die, any number of Parallel Scan Circuits may be included in a die and tested using the test architecture of the disclosure. FIG. 17 below shows one preferred way of accessing plural Parallel Scan Circuits in a die.

FIG. 17 illustrates multiple Parallel Scan Circuits 126*a*, 126*b* in a die 1700 outputting their PTO outputs to a multiplexer 1702. The PTO outputs of the Parallel Scan Circuit to be tested are selected by the multiplexer 1702 to be output on the PTO bus to the TC 124 and to the inputs of buffers "b" 130. Multiplexer 1702 is controlled by PTO select (PTOSEL) signals from the IRO part of the CTL bus of the TCP 122. The multiplexer 1702 allows multiple Parallel Scan Circuits to share a common TC 124, which reduces test circuit overhead in the die 100.

Figure 18:
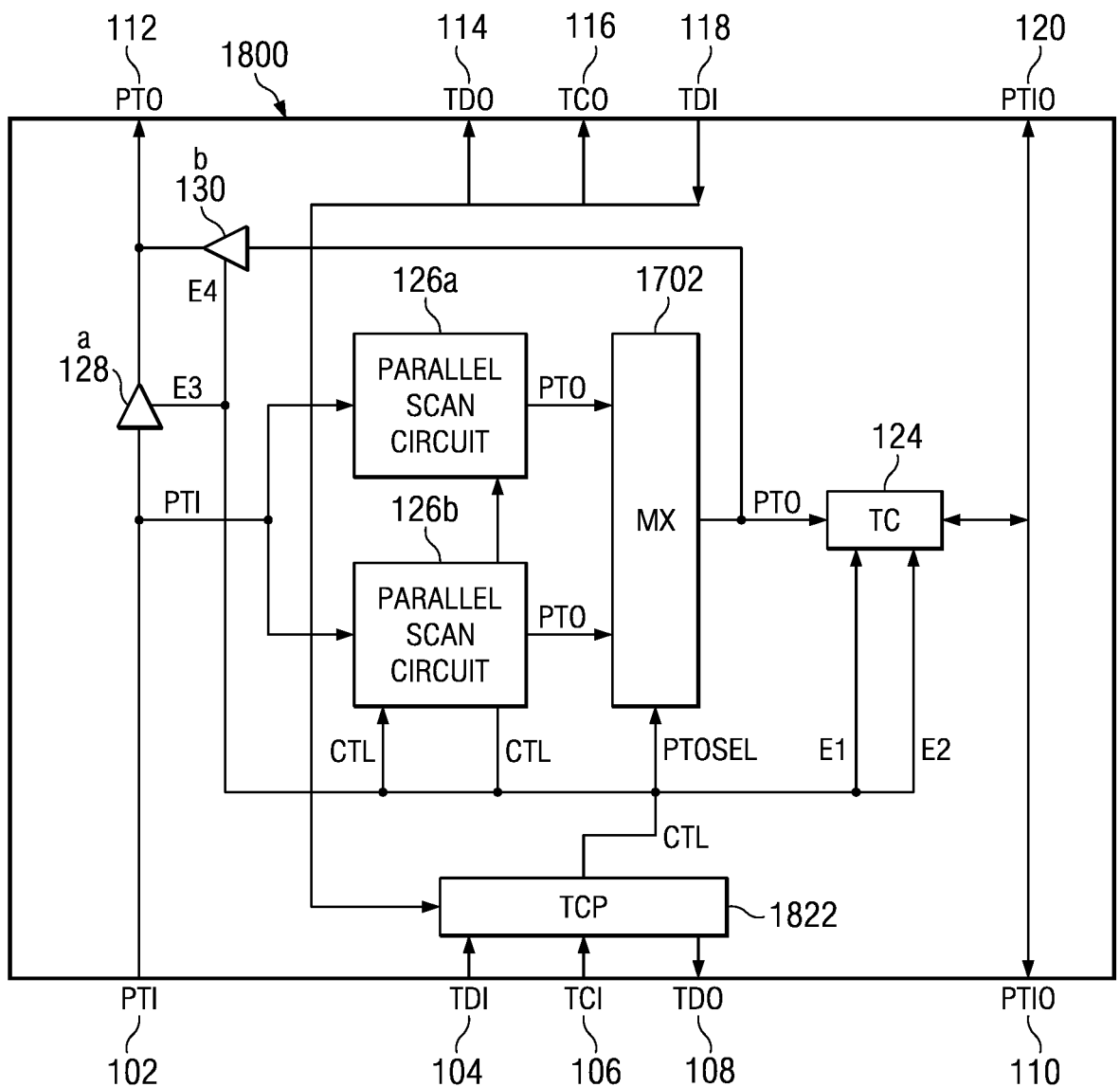
FIG. 18 illustrates the die of FIG. 17 further illustrating the TCP of the disclosure for clarity.

FIG. 18 is the same as FIG. 17 but it includes the TCP 1822 to more clearly illustrate the TCP CTL outputs being connected buffers "a" 128 and "b" 130, Parallel Scan Circuits 126*a*, 126*b*, multiplexer 1702 and TC 124.

Figure 19:
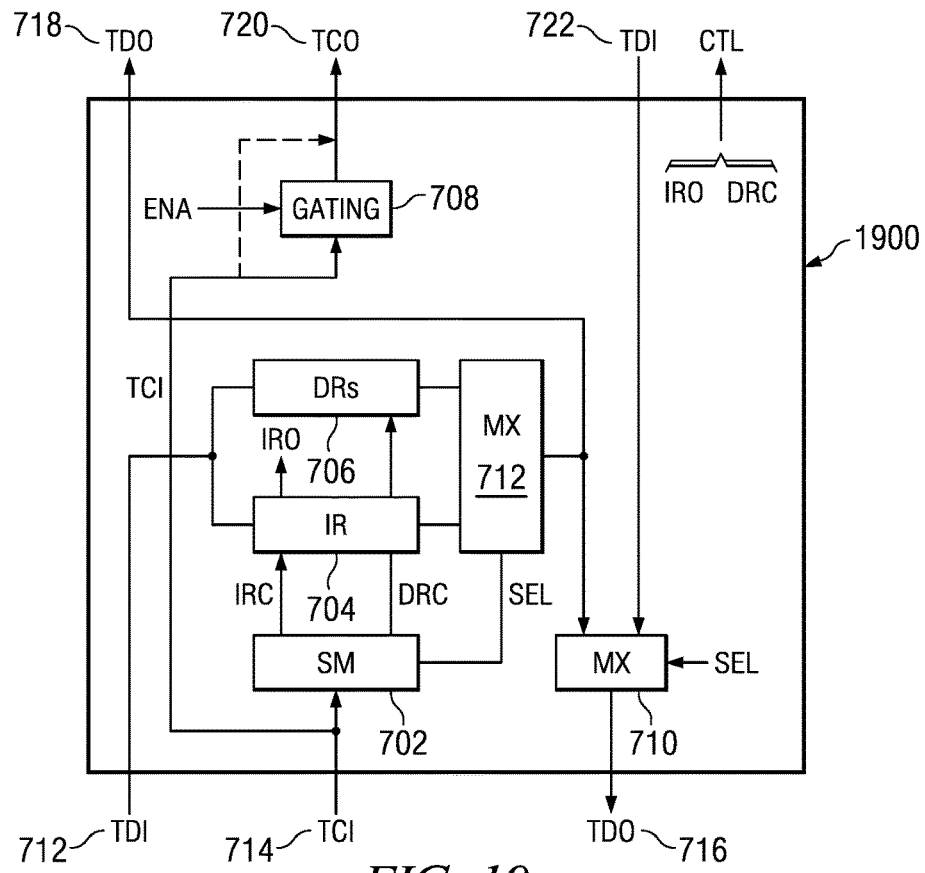
FIG. 19 illustrates an alternate implementation of the TCP of FIG. 7.

FIG. 19 illustrates a third example implementation of the TCP 122 of FIG. 1, similar to the first example implementation of FIG. 7. This third example implementation TCP 1900 includes a state machine (SM) 702, an instruction register (IR) 704, data registers (DRs) 706, a gating circuit 708, first TDO multiplexer (MX) 712 and a second TDO multiplexer (MX) 710. The SM inputs TCI signals and outputs instruction register control (IRC) signals to the IR, data register control (DRC) signals to the DR and a first select (SEL) signal to the first multiplexer 712. During instruction scans, the IR inputs data from TDI and outputs data to the TDO multiplexer 710 and the top surface TDO signal 718, via TDO multiplexer 712. During data scans, a DR inputs data from TDI and outputs data to the TDO multiplexer 710 and the top surface TDO signal 718, via TDO multiplexer 712.

The bottom surface TCI inputs 714 may be coupled to the top surface TCO signals 720 via the gating circuit 708. The top surface TDI signal 722 may be coupled to the bottom surface TDO signal 716 via TDO multiplexer 710. This allows concatenating or daisy-chaining the IR and DR of a TCP of a lower die with an IR and DR of a TCP of a die stacked on top of the lower die. The instruction register outputs (IRO) include an enable (ENA) signal for the gating circuit and a second select (SEL) signal for TDO multiplexer 710. The CTL bus output from the TCP includes IRO signals and DRC signals. The gating circuit 708 may gate one, more than one or all of the TCI signals. Non-gated TCI signals are coupled to appropriate top surface TCO signals, as shown in dotted line. The SM, IR, and DRs of this implementation could be the TAP SM, IR and DRs as defined in the IEEE 1149.1 boundary scan standard.

Figure 20:
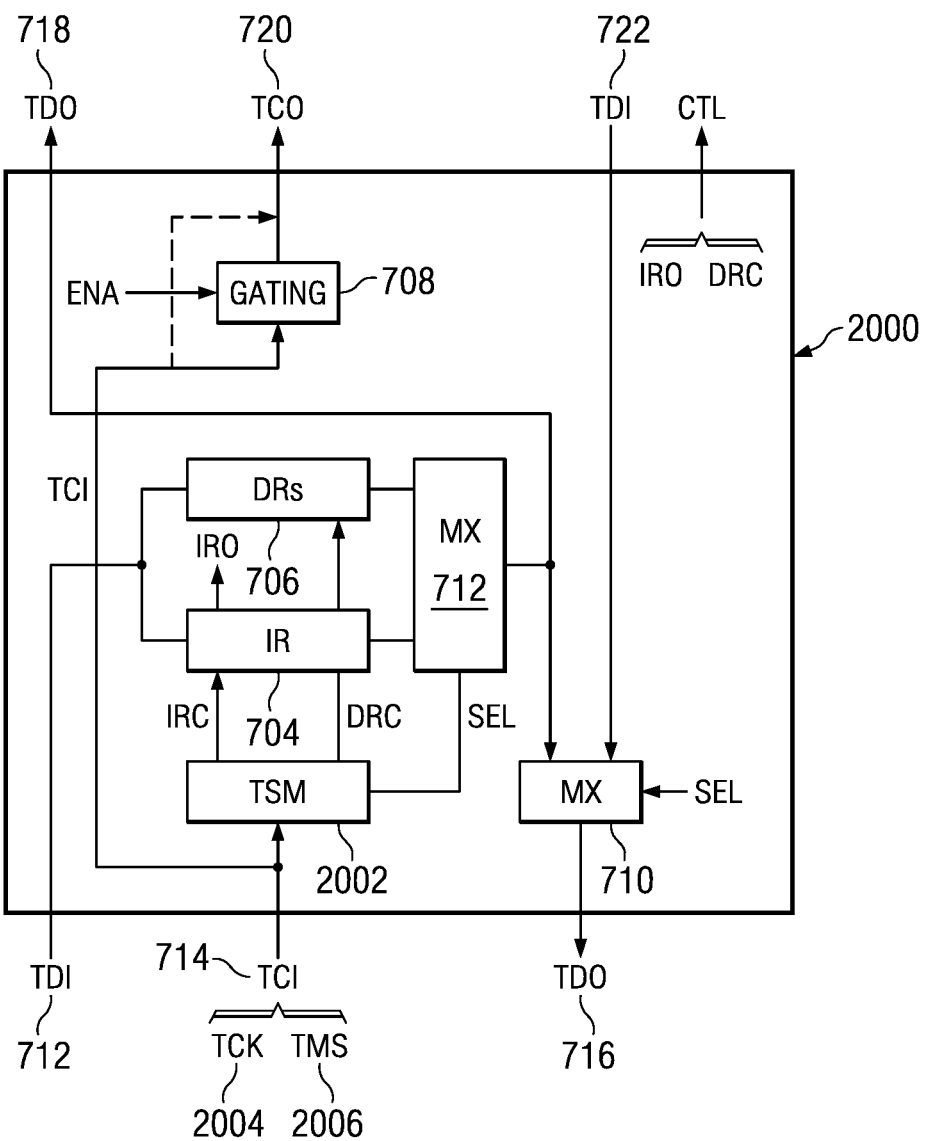
FIG. 20 illustrates the TCP of FIG. 19 were the state machine is an IEEE standard 1149.1 Tap state machine.

FIG. 20 illustrates the TCP 2000 of FIG. 19 where the SM 702 is realized as an IEEE standard 1149.1 Tap State Machine (TSM) 2002. The TCI inputs 714 to the TSM 2002 include a test clock (TCK) 2004 and test mode select (TMS) signal 2006. The gating circuit 708 may gate the TMS signal, the TCK signal or both the TMS and TCK signals. Non-gated TCI signals are coupled to appropriate top surface TCO signals, as shown in dotted line.

Figure 21:
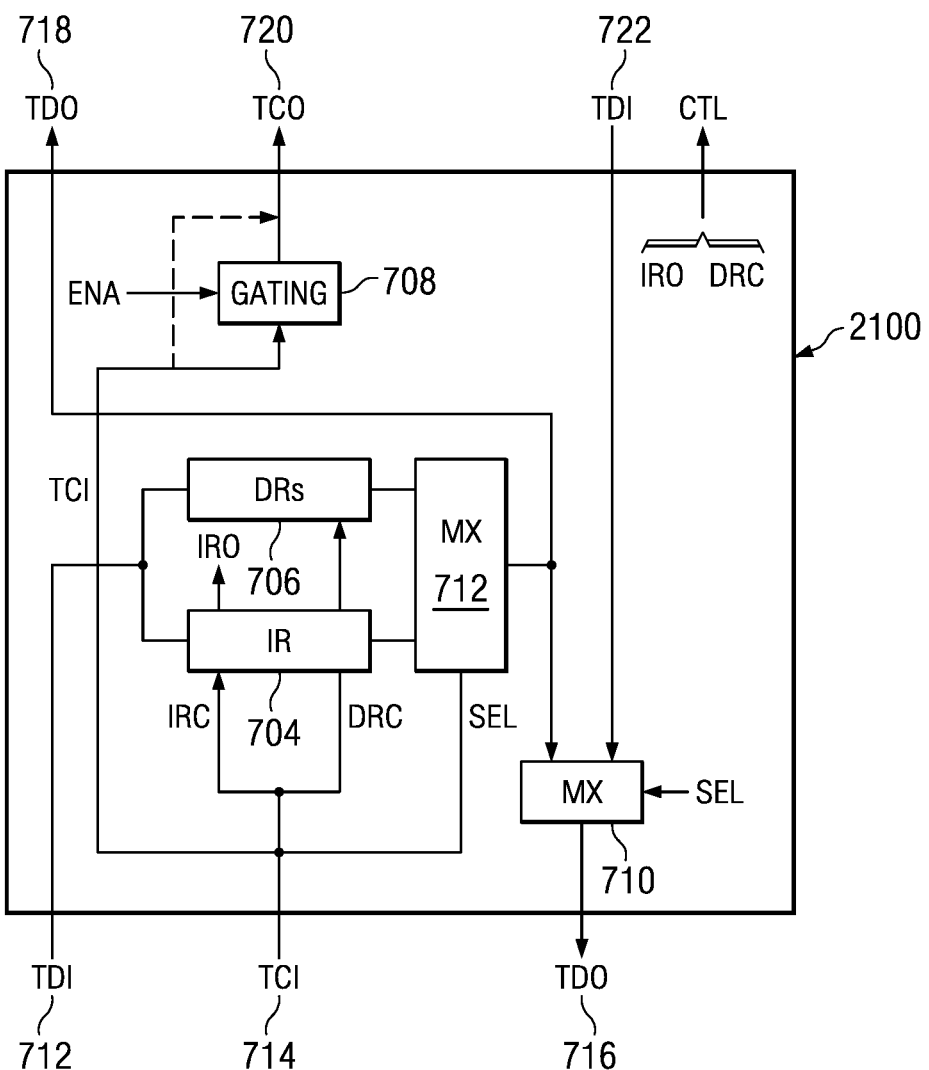
FIG. 21 illustrates an alternate implementation of the TCP of FIG. 8.

FIG. 21 illustrates a fourth example implementation 2100 of the TCP 122 of FIG. 1. This implementation is identical to the FIG. 19 implementation with the exception that it does not include a SM 122. The TCI inputs are coupled to the IRC inputs of IR 704, the DRC inputs of DRs 706 and SEL input of TDO multiplexer 712. During instruction scans, the IR is controlled by IRC signals from the TCI inputs to input data from TDI 712 and output data to the TDO multiplexer 710 and the top surface TDO signal 718, via TDO multiplexer 712. During data scans, a DR is controlled by the DRC signals from the TCI inputs 714 to input data from TDI 712 and output data to the TDO multiplexer 710 and the top surface TDO signal 718, via TDO multiplexer 712.

The bottom surface TCI inputs 714 may be coupled to the top surface TCO signals 720 via the gating circuit 708. The top surface TDI signal 722 may be coupled to the bottom surface TDO signal 716 via the TDO multiplexer 710. This allows concatenating or daisy-chaining the IR and DR of a TCP of a lower die with an IR and DR of a TCP of a die stacked on top of the lower die. The instruction register outputs (IRO) include an enable (ENA) signal for the gating circuit and the SEL signal to TDO multiplexer 710. The CTL bus output from the TCP includes IRO signals and DRC signals. The gating circuit 708 may gate one, more than one or all of the TCI signals. Non-gated TCI are coupled to appropriate top surface TCO signals, as shown in dotted line. The TCI input bus 714, IR and DRs of this implementation could be the control inputs, IR and DRs as defined in IEEE 1500 core wrapper test standard.

Figure 22:
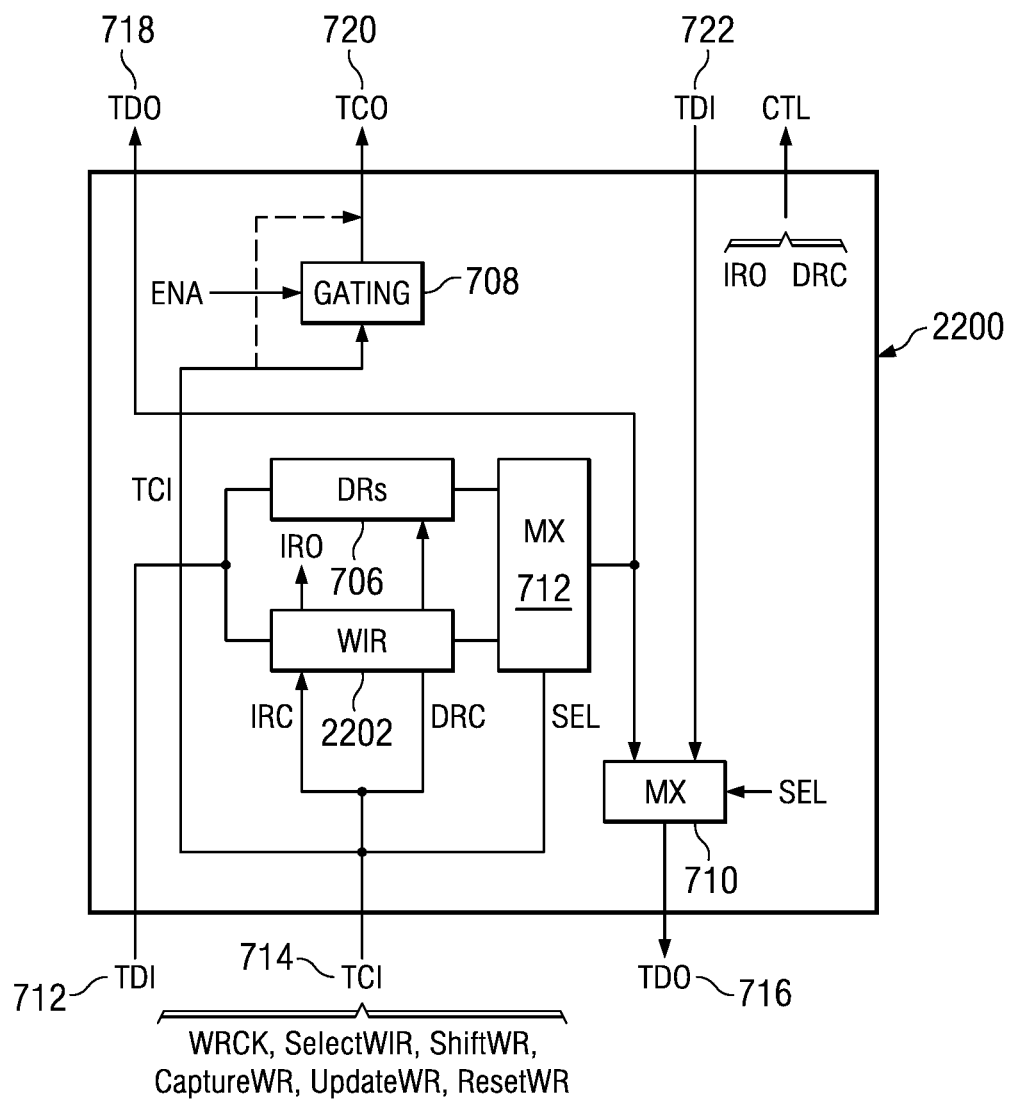
FIG. 22 illustrates the TCP of FIG. 21 were the Test Control Inputs (TCI) inputs include IEEE standard 1500 signals.

FIG. 22 illustrates the TCP 2200 of FIG. 21 where the TCI inputs 714 are defined to be the wrapper control input signals defined in IEEE standard 1500, which includes a wrapper clock (WRCK) signal, select wrapper instruction register (SelectWIR) signal, shift wrapper (ShiftWR) signal, capture wrapper (CaptureWR) signal, update wrapper (UpdateWR) signal and reset wrapper (ResetWR) signal. The wrapper instruction register (WIR) 2202 is the same as the IR of FIG. 8, it is just labeled WIR by IEEE 1500. The gating circuit 708 may gate one, more than one or all of the TCI signals. Non-gated TCI signals a coupled to appropriate top surface TCO signals, as shown in dotted line.

Figure 23:
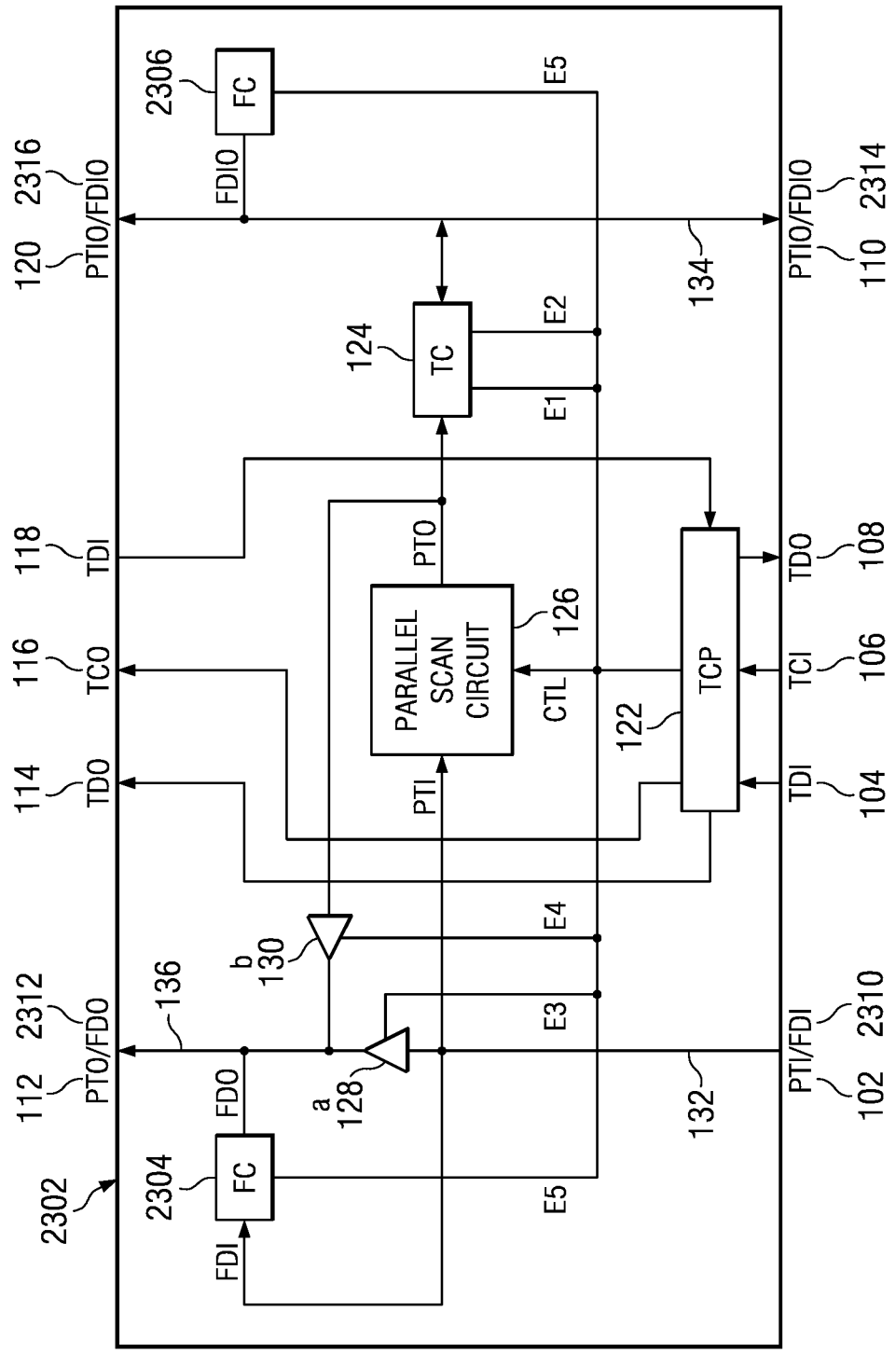
FIG. 23 illustrates a die including the test architecture of the disclosure where the Parallel Test Input (PTI) and Parallel Test Inputs and Outputs (PTIO) are shared for both test and functional signaling.

FIG. 23 illustrates a die 2302 including the test architecture of the disclosure. Die 2302 differs from die 100 of FIG. 1 as follows; (1) the PTI TSVs 132 are shared between inputting PTI signals 102 to the test architecture and inputting functional data input (FDI) signals 2310 to functional circuitry (FC) 2304 of the die, (2) the PTO TSVs 136 are shared between outputting PTO signals 112 from the test architecture and outputting function data output (FDO) signals 2312 from the FC 2304 and (3) the PTIO TSVs 134 are shared between inputting or outputting PTIO 110, 120 signals to the test architecture and inputting or outputting functional data input/output (FDIO) signals 2314, 2316 to functional circuitry (FC) 2306 of the die. When the die is in functional mode, an instruction in the TCP 122 will disable buffers "a" 128 and "b" 130 and disable the buffers in the TC 124.

In functional mode, FDI can be input to FC 2304 via TSVs 132, FDO can be output from FC 2304 via TSVs 136 and FDIO can be input and output to FC 2006 via TSVs 134. When the die is in test mode, an instruction in the TCP 122 will disable the outputs of FC 2004 and 2006 using an enable signal (E5) from the CTL output of TCP 122. In test mode, PTI can be input to the test architecture via TSVs 132, PTO can be output from the test architecture via TSVs 136 and PTIO can be input to or output from the test architecture via TSVs 134, as previously described.

Figure 24:
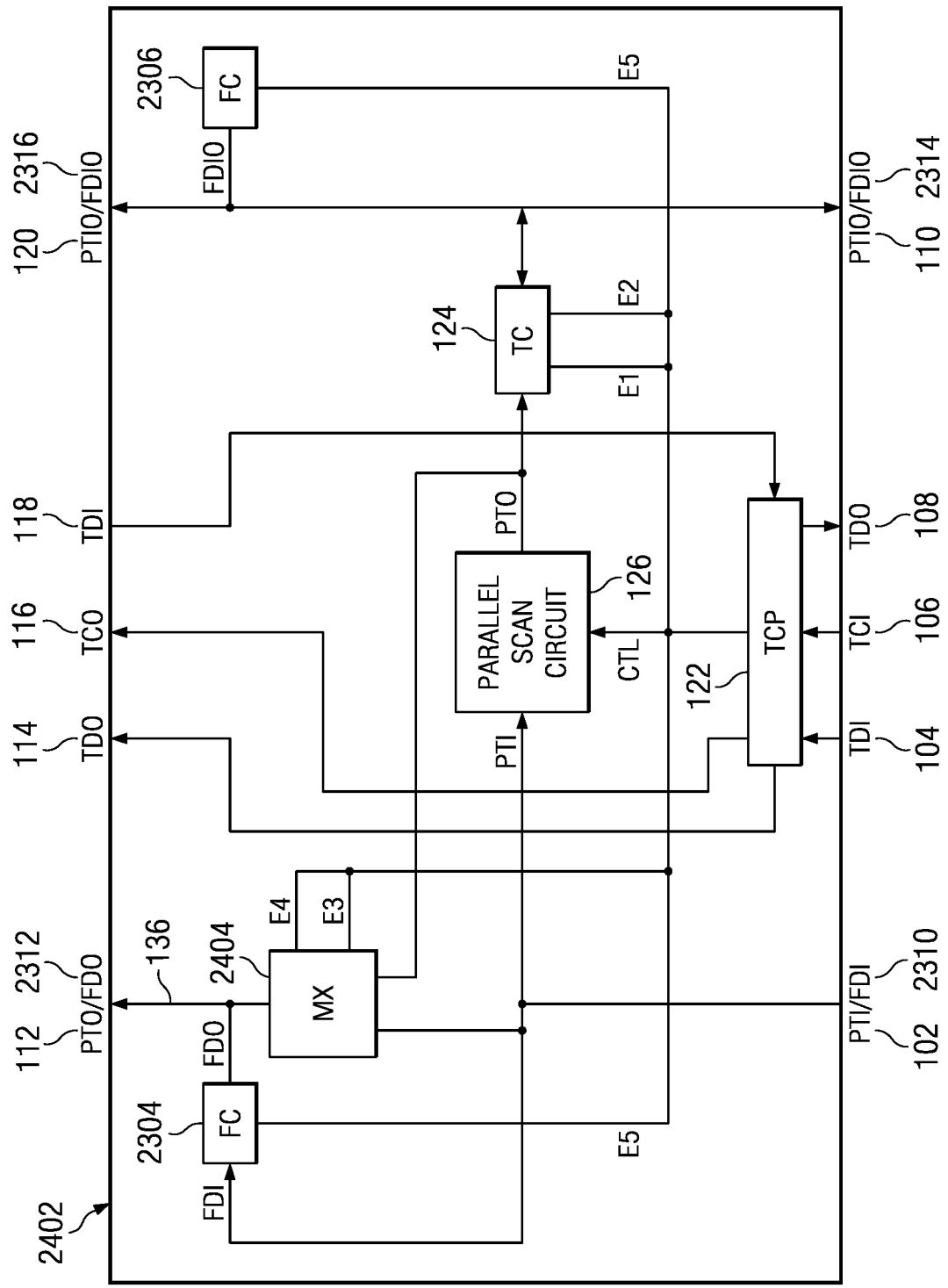
FIG. 24 illustrates the die of FIG. 23 where a multiplexer is substituted for buffers "a" and "b".

FIG. 24 illustrates a die 2402 include the test architecture of the disclosure. The only difference between the die 2302 of FIG. 23 and die 2402 of FIG. 24 is that a 3-state multiplexer 2404 is shown being used in die 2402 in place of buffers "a" and "b". The E3 input to the multiplexer selects either PTI data from TSVs 132 or the PTO data from the Parallel Scan Circuit to be output to TSVs 136. The E4 input to the multiplexer enables or disables the multiplexer outputs to TSVs 136. The multiplexer operates the same as the buffers "a" and "b" described in FIG. 23.

In this disclosure the words connected and coupled both mean a "link" formed between elements mentioned in this disclosure. The elements could be, but are not limited to circuits, buses and contact points. The links may be direct links such as links formed between two elements by a wire or they may be indirect links such as a links formed between elements through intermediate circuitry, registered circuitry or buffered circuitry for example.

The invention claimed is:

1. An integrated circuit device comprising:
a first surface including a first plurality of pads;
a second surface opposite the first surface, the second surface including a second plurality of pads, wherein:
each of the first plurality of pads is coupled to a corresponding pad of the second plurality of pads by a first signal path which does not include a register to form a first plurality of pad pairs;

each pad pair of the first plurality of pad pairs includes a pad of the first plurality of pads, the corresponding pad of the second plurality of pads, and a corresponding first signal path; and the first signal path of each of the first plurality of pad pairs includes a first switch circuit;

a first test control input pad on the first surface and a first test control output pad on the second surface;

a first test data input pad on the first surface and a first test data output pad on the second surface;

a second test data output pad on the first surface and a second test data input pad on the second surface;

a first test control port coupled to the first test control input pad, the first test control output pad, the first test data input pad, first test data output pad, the second test data output pad, and the second test data input pad, the first test control port including a first test access port state machine, a first instruction register, a first data register, and a first control signal output coupled to the first switch circuit.

2. The integrated circuit device of claim 1, further comprising:

a first parallel scan circuit including first parallel test inputs, wherein:

each of the first parallel test inputs is coupled to a first signal path of a corresponding pair of the first plurality of pad pairs, first parallel test outputs, and a first control input; and the first test control port further includes a second control signal output coupled to the first control input.

3. The integrated circuit device of claim 2, wherein:

each of the first parallel test outputs is coupled to a first signal path of a corresponding pair of the first plurality of pad pairs by a second signal path; and the second signal path of each of the first plurality of pad pairs includes a second switch circuit.

4. The integrated circuit device of claim 3, wherein:

the first switch circuit and the second switch circuit each include a buffer, a multiplexer, or a transistor switch.

5. The integrated circuit device of claim 1, further including:

a gating circuit including an input coupled to the first test control input pad and an output coupled to the first test control output pad.

6. The integrated circuit device of claim 5, wherein:

the first test control input pad is configured to receive a test mode select signal.

7. The integrated circuit device of claim 1, wherein:

the first surface further includes a third plurality of pads;

the second surface further includes a fourth plurality of pads;

each of the third plurality of pads is coupled to a corresponding pad of the fourth plurality of pads by a third signal path which does not include a register to form a second plurality of pad pairs;

the first test control port includes a third control signal output, and further including:

a plurality of first test circuits, wherein:

each of the plurality of the first test circuits is coupled to the third control signal output, a first signal path of a corresponding pair of the first plurality of pad pairs and a third signal path of a corresponding pair of the second plurality of pad pairs and configurable to compare a signal of the first signal path and a signal of the third signal path in response to a signal of the third control signal output.

8. The integrated circuit device of claim 7, wherein:

each of the plurality of the first test circuits is further configurable to propagate a signal of the first signal path to the third signal path in response to a signal of the third control signal output.

9. An integrated circuit device comprising:

a first die including:

a first surface including a first plurality of pads;

a second surface opposite the first surface, the second surface including a second plurality of pads, wherein:

each of the first plurality of pads is coupled to a corresponding pad of the second plurality of pads by a first signal path which does not include a register to form a first plurality of pad pairs;

each pad pair of the first plurality of pad pairs includes a pad of the first plurality of pads, the corresponding pad of the second plurality of pads, and a corresponding first signal path; and the first signal path of each of the first plurality of pad pairs includes a first switch circuit;

a parallel test input pad on the first surface and a parallel test output pad on the second surface;

a first test control input pad on the first surface and a first test control output pad on the second surface;

a first test data input pad on the first surface and a first test data output pad on the second surface;

a second test data output pad on the first surface and a second test data input pad on the second surface;

a first test control port coupled to the first test control input pad, the first test control output pad, the first test data input pad, first test data output pad, the second test data output pad and the second test data input pad, the first test control port including a first test access port state machine, a first instruction register, a first data register, and a first control signal output coupled to the first switch circuit, a second die including:

a third surface adjacent to the second surface, the third surface including a fifth plurality of pads coupled to the second plurality of pads;

a fourth surface opposite the third surface, the fourth surface including a sixth plurality of pads, wherein:

each of the fifth plurality of pads is coupled to a corresponding pad of the sixth plurality of pads by a fourth signal path which does not include a register to form a third plurality of pad pairs; and the fourth signal path of each of the third plurality of pad pairs includes a third switch circuit;

a second test control input pad on the third surface coupled to the first test control output pad;

second test control output pad on the fourth surface;

a third test data input pad on the third surface coupled to the first test data output pad;

a third test data output pad on the fourth surface;

a fourth test data output pad on the third surface coupled to the second test data input pad;

a fourth test data input pad on the fourth surface;

a second test control port coupled to the second test control input pad, the second test control output pad, the third test data input pad, third test data output pad, the fourth test data output pad and the fourth test data input pad, the second test control port including a second test access port state machine, a second instruction register, a second data register, a fourth control signal output coupled to the third switch circuit.

10. The integrated circuit device of claim 9, wherein:
the first die further includes:
a first gating circuit including an input coupled to the first test control input pad and an output coupled to the first test control output pad, and the second die further includes:
a second gating circuit including an input coupled to the second test control input pad and an output coupled to the second test control output pad.

11. The integrated circuit device of claim 9, wherein:
the first die further includes:
a first parallel scan circuit including first parallel test inputs, wherein:
each of the first parallel test inputs is coupled to a first signal path of a corresponding pair of the first plurality of pad pairs, first parallel test outputs, and a first control input; and
the first test control port further includes a second control signal output coupled to the first control input,
the second die further includes:
a second parallel scan circuit including second parallel test inputs, each of the second parallel test inputs is coupled to a fourth signal path of a corresponding pair of the third plurality of pad pairs, second parallel test outputs, and a second control input, and
the second test control port further includes a fifth control signal output coupled to the second control input.

12. The integrated circuit device of claim 11, wherein:
in the first die:
each of the first parallel test outputs is coupled to a first signal path of a corresponding pair of the first plurality of pad pairs by a second signal path; and
the second signal path of each of the first plurality of pad pairs includes a second switch circuit, and
in the second die:
each of the second parallel test outputs is coupled to a fourth signal path of a corresponding pair of the third plurality of pad pairs by a fifth signal path; and
the fifth signal path of each of the third plurality of pad pairs includes a fourth switch circuit.

13. The integrated circuit device of claim 12, operable in a first test mode wherein:
the first switch circuit is closed;
the second switch circuit is open;
the first parallel scan circuit is disabled;
the third switch circuit is open;
the fourth switch circuit is open; and
the second parallel scan circuit is enabled.

14. The integrated circuit device of claim 12, operable in a second test mode wherein:
the first switch circuit is open;
the second switch circuit is closed;
the first parallel scan circuit is enabled;
the third switch circuit is open;
the fourth switch circuit is open; and
the second parallel scan circuit is enabled.

15. The integrated circuit device of claim 12, wherein:
in the first die:
the first surface further includes a third plurality of pads;
the second surface further includes a fourth plurality of pads, wherein each of the third plurality of pads is coupled to a corresponding pad of the fourth plurality of pads by a third signal path which does not include a register to form a second plurality of pad pairs;
the first test control port includes a third control signal output, and the first die further includes a plurality of first test circuits, wherein:
each of the plurality of the first test circuits is coupled to the third control signal output, a corresponding first signal path of the first plurality of pad pairs and a corresponding third signal path of the second plurality of pad pairs and configurable to compare a signal of the first signal path and a signal of the third signal path in response to a signal of the third control signal output, and
in the second die:
the third surface further includes a seventh plurality of pads coupled to the fourth plurality of pads;
the fourth surface further includes an eighth plurality of pads, wherein each of the seventh plurality of pads is coupled to a corresponding pad of the eighth plurality of pads by a sixth signal path which does not include a register to form a fourth plurality of pad pairs;
the second test control port includes a sixth control signal output, and the second die further includes a plurality of second test circuits, wherein:
each of the plurality of the second test circuits is coupled to the sixth control signal output, a corresponding fourth signal path of the third plurality of pad pairs and a corresponding sixth signal path of the fourth plurality of pad pairs and configurable to compare a signal of the fourth signal path and a signal of the sixth signal path in response to a signal of the sixth control signal output.

16. The integrated circuit device of claim 15, wherein:
each of the plurality of the first test circuits is further configurable to propagate a signal of the first signal path to the third signal path in response to a signal of the third control signal output, and
each of the plurality of the second test circuits is further configurable to propagate a signal of the fourth signal path to the sixth signal path in response to a signal of the sixth control signal output.

17. The integrated circuit device of claim 15, operable in a third test mode wherein:
the first switch circuit is closed;
the second switch circuit is open;
the first parallel scan circuit is disabled;
a first test circuit of the first plurality of test circuits is disabled;
the third switch circuit is open;
the fourth switch circuit is open;
the second parallel scan circuit is enabled; and
a second test circuit of the second plurality of test circuits is configured to propagate a signal of the fourth signal path to the sixth signal path.

18. The integrated circuit device of claim 15, operable in a fourth test mode wherein:
the first switch circuit is closed;
the second switch circuit is open;
the first parallel scan circuit is disabled;
a first test circuit of the first plurality of test circuits is disabled;
the third switch circuit is open;
the fourth switch circuit is open;
the second parallel scan circuit is enabled; and a second test circuit of the second plurality of test circuits is configured to compare a signal of the fourth signal path and a signal of the sixth signal path.

19. The integrated circuit device of claim 15, operable in a fifth test mode wherein:
the first switch circuit is open;
the second switch circuit is closed;
the first parallel scan circuit is enabled;
a first test circuit of the first plurality of test circuits is disabled;
the third switch circuit is open;
the fourth switch circuit is open;
the second parallel scan circuit is enabled; and
a second test circuit of the second plurality of test circuits is configured to propagate a signal of the fourth signal path to the sixth signal path.

20. The integrated circuit device of claim 15, operable in a sixth test mode wherein:
the first switch circuit is open;
the second switch circuit is closed;
the first parallel scan circuit is enabled;
a first test circuit of the plurality of first test circuits is disabled;
the third switch circuit is open;
the fourth switch circuit is open;
the second parallel scan circuit is enabled; and
a second test circuit of the second plurality of test circuits is configured to compare a signal of the fourth signal path and a signal of the sixth signal path.

* * * * *